(12) United States Patent
Miyake et al.

(10) Patent No.: US 8,928,645 B2
(45) Date of Patent: Jan. 6, 2015

(54) LIQUID CRYSTAL DISPLAY DEVICE

(75) Inventors: Hiroyuki Miyake, Atsugi (JP); Koji Kusunoki, Kawasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 592 days.

(21) Appl. No.: 13/109,496

(22) Filed: May 17, 2011

(65) Prior Publication Data

US 2011/0285688 A1   Nov. 24, 2011

(30) Foreign Application Priority Data

May 21, 2010  (JP) .................................. 2010-117010

(51) Int. Cl.
*G06F 3/038* (2013.01)
*G09G 3/36* (2006.01)

(52) U.S. Cl.
CPC ............ *G09G 3/3655* (2013.01); *G09G 3/3614* (2013.01)
USPC ............. 345/211; 345/212; 345/209; 345/98; 345/96; 345/90; 345/87; 345/54; 345/52

(58) Field of Classification Search
None
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,764,321 A | 6/1998 | Koyama et al. | |
| 5,847,687 A | 12/1998 | Hirakata et al. | |
| 5,959,599 A | 9/1999 | Hirakata | |
| 6,243,064 B1 | 6/2001 | Hirakata | |
| 6,294,274 B1 | 9/2001 | Kawazoe et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Joseph Haley
*Assistant Examiner* — Ifedayo Iluyomade
(74) *Attorney, Agent, or Firm* — Eric J. Robinson; Robinson Intellectual Property Law Office, P.C.

(57) ABSTRACT

In a liquid crystal display device, amplitude voltage of an image signal written into a signal line can be decreased. A liquid crystal display device in which frame inversion driving is performed includes pixels each including a liquid crystal element and a transistor that controls voltage applied to a first electrode of the liquid crystal element. A scan line is electrically connected to gates of transistors in pixels in a corresponding row. A common line is electrically connected to second electrodes of liquid crystal elements in pixels in the corresponding row. In a first frame period, a first potential is sequentially supplied to the common lines in synchronization with sequential selection of the scan lines. In a second frame period adjacent to the first frame period, a second potential different from the first potential is sequentially supplied to the common lines in synchronization with sequential selection of the scan lines.

9 Claims, 23 Drawing Sheets

(56) References Cited

U.S. PATENT DOCUMENTS

| | | |
|---|---|---|
| 6,456,269 B2 | 9/2002 | Hirakata |
| 6,563,174 B2 | 5/2003 | Kawasaki et al. |
| 6,704,066 B2 | 3/2004 | Tsumura et al. |
| 6,704,067 B2 | 3/2004 | Tsumura et al. |
| 6,727,522 B1 | 4/2004 | Kawasaki et al. |
| 6,911,962 B1 | 6/2005 | Hirakata et al. |
| 6,940,481 B2 | 9/2005 | Konno et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,336,249 B2 | 2/2008 | Hirakata et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,619,693 B2 | 11/2009 | Fujioka et al. |
| 7,674,650 B2 | 3/2010 | Akimoto et al. |
| 7,732,819 B2 | 6/2010 | Akimoto et al. |
| 7,760,179 B2 | 7/2010 | Lee |
| 7,768,589 B2 | 8/2010 | Miyachi et al. |
| 7,898,629 B2 | 3/2011 | Ono et al. |
| 8,169,559 B2 | 5/2012 | Woo et al. |
| 2001/0015710 A1 | 8/2001 | Hirakata |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0080932 A1 | 5/2003 | Konno et al. |
| 2003/0090448 A1 | 5/2003 | Tsumura et al. |
| 2003/0169379 A1 | 9/2003 | Tsumura et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0227273 A1 | 10/2006 | Shin et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0080370 A1 | 4/2007 | Miyachi et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0188431 A1* | 8/2007 | Sato et al. ............... 345/90 |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0297676 A1 | 12/2008 | Kimura et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141204 A1* | 6/2009 | Numao ............... 349/39 |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025676 A1 | 2/2010 | Yamazaki et al. |
| 2010/0033663 A1* | 2/2010 | Miyachi et al. ............... 349/138 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0321600 A1 | 12/2010 | Miyachi et al. |
| 2011/0279427 A1 | 11/2011 | Umezaki et al. |
| 2011/0285687 A1 | 11/2011 | Umezaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-189614 | 7/2005 |
| JP | 2007-271839 A | 10/2007 |
| WO | WO-2004/114391 | 12/2004 |
| WO | WO-2005/059637 | 6/2005 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHD RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys.Lett. (Applied Physics Letters) , Sep. 1, 2003, vol. 83, No. 9, pp. 1755-1757.

* cited by examiner

First Shift Register    Second Shift Register

LIQUID CRYSTAL DISPLAY DEVICE

BACKGROUND OF THE INVENTION

1. Field of the Invention

An embodiment of the present invention relates to a liquid crystal display device and an electronic device including the liquid crystal display device. In addition, an embodiment of the present invention relates to a method for driving a liquid crystal display device.

2. Description of the Related Art

Liquid crystal display devices ranging from a large display device such as a television receiver to a small display device such as a mobile phone have been spreading. From now on, products with higher added values will be needed and are being developed. In recent years, for high image quality and higher added values, a liquid crystal material exhibiting a blue phase (hereinafter also referred to as blue-phase liquid crystal) has attracted attention. Blue-phase liquid crystal can respond to an electric field at very high speed in comparison with conventional liquid crystal materials, and the use of blue-phase liquid crystal for a liquid crystal display device needed to be driven at a high frame frequency for displaying a stereoscopic (3D) image or the like has attracted attention.

Patent Document 1 discloses an in-plane switching (IPS) mode as a method for driving a blue-phase liquid crystal element. Patent Document 1 particularly discloses a structure of electrodes between which a liquid crystal material is provided, for reducing voltage for driving a liquid crystal element.

REFERENCE

Patent Document

[Patent Document 1] Japanese Published Patent Application No. 2007-271839

SUMMARY OF THE INVENTION

An in-plane switching (IPS) mode, which is described in Patent Document 1 and is a method for driving a blue-phase liquid crystal element, has a problem of high driving voltage in the case of AC driving. A cause of need for the high driving voltage is described below with reference to FIGS. 23A and 23B.

FIG. 23A illustrates a circuit configuration of a pixel included in a liquid crystal display device. A pixel 2300 includes a transistor 2301, a liquid crystal element 2302, and a storage capacitor 2303. An image signal (also referred to as a video signal) is input to a signal line (also referred to as a data line, a source line, or a data signal line) 2304, and a gate signal (also referred to as a scan signal or a selection signal) is input to a scan line (also referred to as a gate line or a gate signal line) 2305. Further, a common potential is input to a common line (also referred to as a common potential line) 2306, and a fixed potential is input to a capacitor line 2307. Note that for convenience of description, an electrode of the liquid crystal element 2302 which is connected to the transistor 2301 is referred to as a first electrode (also referred to as a pixel electrode), and an electrode of the liquid crystal element 2302 which is connected to the common line 2306 is referred to as a second electrode (also referred to as a counter electrode).

In addition, in the liquid crystal display device, AC driving is performed by inverting the polarity of voltage to be applied to the first electrode with respect to the potential of the second electrode (common potential) in the liquid crystal element every certain period, in order to suppress degradation (burn-in) of the liquid crystal element. Examples of AC driving include frame inversion driving, gate line inversion driving, source line inversion driving, dot line inversion driving, and the like.

For example, frame inversion driving is a driving method in which the polarity of voltage applied to a liquid crystal element is inverted every frame period. Note that one frame period corresponds to a period for displaying an image for one screen. Although there is no particular limitation on the length of one frame period, it is preferable that the one frame period be less than or equal to 1/60 second so that a person viewing an image does not perceive a flicker.

In addition, gate line inversion driving is a driving method in which the polarity of voltage applied to liquid crystal elements included in pixels connected to the same scan line is inverted with respect to liquid crystal elements included in pixels connected to the adjacent scan line, and further, frame inversion is performed on each pixel.

FIG. 23B shows an example of a timing chart for explaining the operation of the pixel 2300 in FIG. 23A in the case where inversion driving is performed. FIG. 23B shows a timing chart of the potentials of the scan line (GL), the signal line (SL), the common line (CL), the first electrode (PE), and the second electrode (CE) in one frame period as for each of an inversion driving period 2311 and a non-inversion driving period 2312 of the inversion driving.

In FIG. 23B, the potential of a scan signal of the scan line (GL) is Vgh in a period for selecting a pixel, that is, a period during which the transistor 2301 is in a conduction state (also referred to as an ON state), and is Vgl in the other period, that is, a period during which the transistor 2301 is in a non-conduction state (also referred to as an OFF state) (Vgh>Vgl). Further, the potential of the image signal of the signal line (SL) varies in accordance an image to be displayed. Here, the potential for non-inversion driving is Vdh, and the potential for the inversion driving is Vdl (Vdh>Vdl).

Note that although the potential (PE) of the first electrode varies depending on the grayscale of the image signal of the signal line (SL), in FIG. 23B, for convenience of description, the potential (PE) is inverted (becomes Vdh or Vdl) in response to the scan signal of the scan line (GL). In addition, in FIG. 23B, the potential of the common potential line (CL), that is, the potential (CE) of the second electrode is Vc (constant).

In a driving method with the use of inversion driving which is described with reference to FIG. 23B, by inverting the polarity of the potential of the image signal, the potential of the first electrode of the liquid crystal element 2302 is changed, and the polarity of the voltage applied between the first electrode and the second electrode is switched. Therefore, the range of the potential of the image signal written into the signal line (SL) is twice that in the case where the frame inversion driving is not performed. Therefore, the amplitude voltage of the image signal is high and power consumption is high.

In view of the above, it is an object of an embodiment of the present invention to provide a liquid crystal display device in which amplitude voltage of an image signal written into a signal line can be decreased.

It is another object of an embodiment of the present invention to provide a liquid crystal display device in which voltage of a scan line driver circuit and amplitude voltage of an image signal written into a signal line can be decreased.

It is another object of an embodiment of the present invention to provide a liquid crystal display device in which frame inversion driving is performed and amplitude voltage of an image signal written into a signal line can be decreased, and a method for driving the liquid crystal display device.

It is another object of an embodiment of the present invention to provide a liquid crystal display device in which frame inversion driving is performed and voltage of a scan line driver circuit and amplitude voltage of an image signal written into a signal line can be decreased, and a method for driving the liquid crystal display device.

It is another object of an embodiment of the present invention to provide a liquid crystal display device in which gate line inversion driving is performed and amplitude voltage of an image signal written into a signal line can be decreased, and a method for driving the liquid crystal display device.

It is another object of an embodiment of the present invention to provide a liquid crystal display device in which gate line inversion driving is performed and voltage of a scan line driver circuit and amplitude voltage of an image signal written into a signal line can be decreased, and a method for driving the liquid crystal display device.

According to an embodiment of the present invention, a liquid crystal display device in which frame inversion driving is performed includes pixels, common lines, and scan lines. Each of the pixels includes a liquid crystal element and a transistor configured to control voltage applied to a first electrode of the liquid crystal element. One of the scan lines is electrically connected to gates of transistors included in pixels arranged in a corresponding row. One of the common lines is electrically connected to second electrodes of liquid crystal elements included in pixels arranged in a corresponding row. In a first frame period, a first potential is sequentially supplied to (held in) the common lines in synchronization with sequential selection of the scan lines. In a second frame period adjacent to the first frame period, a second potential is sequentially supplied to (held in) the common lines in synchronization with sequential selection of the scan lines. Note that the first potential and the second potential are different from each other.

According to an embodiment of the present invention, the liquid crystal display device further includes a shift register configured to supply a potential held in the common lines, and the shift register includes a reset pulse output circuit and a set pulse output circuit.

According to an embodiment of the present invention, a liquid crystal display device in which gate line inversion driving is performed includes pixels, first common lines, second common lines, and scan lines. Each of the pixels includes a liquid crystal element and a transistor configured to control voltage applied to a first electrode of the liquid crystal element. One of the scan lines is electrically connected to gates of transistors included in pixels arranged in a corresponding row. One of the first common lines is electrically connected to second electrodes of liquid crystal elements included in pixels arranged in a corresponding odd-numbered row. One of the second common lines is electrically connected to second electrodes of liquid crystal elements included in pixels arranged in a corresponding even-numbered row. In a first frame period, alternate supply (hold) of a first potential to one of the first common lines and a second potential to one of the second common lines is sequentially performed in synchronization with sequential selection of the scan lines. In a second frame period adjacent to the first frame period, alternate supply (hold) of the second potential to the one of the first common lines and the first potential to the one of the second common lines is sequentially performed in synchronization with sequential selection of the scan lines. Note that the first potential and the second potential are different from each other.

According to an embodiment of the present invention, the liquid crystal display further includes a first shift register configured to supply a potential held in the first common lines, and a second shift register configured to supply a potential held in the second common lines. The first shift register and the second shift register each include a reset pulse output circuit and a set pulse output circuit.

According to an embodiment of the present invention, the reset pulse output circuit includes a first transistor to a ninth transistor, a first input terminal to a fifth input terminal, an output terminal, and a first power supply line to an eighth power supply line. In the reset pulse output circuit, a first terminal of the first transistor is connected to the first power supply line, a second terminal of the first transistor is connected to a first terminal of the fifth transistor, and a gate of the first transistor is connected to the fourth input terminal. A first terminal of the second transistor is connected to the first terminal of the fifth transistor, a second terminal of the second transistor is connected to the second power supply line, and a gate of the second transistor is connected to a gate of the fourth transistor. A first terminal of the third transistor is connected to the second input terminal, a second terminal of the third transistor is connected to the output terminal, and a gate of the third transistor is connected to a second terminal of the fifth transistor. A first terminal of the fourth transistor is connected to the output terminal, and a second terminal of the fourth transistor is connected to the third power supply line. A gate of the fifth transistor is connected to the fourth power supply line. A first terminal of the sixth transistor is connected to the fifth power supply line, a second terminal of the sixth transistor is connected to the gate of the fourth transistor, and a gate of the sixth transistor is connected to the third input terminal. A first terminal of the seventh transistor is connected to the sixth power supply line, a second terminal of the seventh transistor is connected to the gate of the fourth transistor, and a gate of the seventh transistor is connected to the first input terminal. A first terminal of the eighth transistor is connected to the seventh power supply line, a second terminal of the eighth transistor is connected to the gate of the fourth transistor, and a gate of the eighth transistor is connected to the fifth input terminal A first terminal of the ninth transistor is connected to the gate of the fourth transistor, a second terminal of the ninth transistor is connected to the eighth power supply line, and a gate of the ninth transistor is connected to the fourth input terminal.

The first transistor to the ninth transistor in the reset pulse output circuit may be n-channel transistors.

According an embodiment of the present invention, the reset pulse output circuit includes a first transistor to an eighth transistor, a first input terminal to a fourth input terminal, an output terminal, and a first power supply line to a seventh power supply line. In the reset pulse output circuit, a first terminal of the first transistor is connected to the first power supply line, a second terminal of the first transistor is connected to a first terminal of the fifth transistor, and a gate of the first transistor is connected to the fourth input terminal. A first terminal of the second transistor is connected to the first terminal of the fifth transistor, a second terminal of the second transistor is connected to the second power supply line, and a gate of the second transistor is connected to a gate of the fourth transistor. A first terminal of the third transistor is connected to the second input terminal, a second terminal of the third transistor is connected to the output terminal, and a gate of the third transistor is connected to a second terminal of the fifth transistor. A first terminal of the fourth transistor is connected to the output terminal, and a second terminal of the fourth transistor is connected to the third power supply line. A gate of the fifth transistor is connected to the fourth power supply line. A first terminal of the sixth transistor is connected to the fifth power supply line, a second terminal of the sixth transistor is connected to the gate of the fourth transistor, and a gate of the sixth transistor is connected to the third input terminal. A first terminal of the seventh transistor is connected to the sixth power supply line, a second terminal of the seventh transistor is connected to the gate of the fourth transistor, and a gate of the seventh transistor is connected to the first input terminal. A first terminal of the eighth transistor is connected to the gate of the fourth transistor, a second terminal of the eighth transistor is connected to the seventh power supply line, and a gate of the eighth transistor is connected to the fourth input terminal.

The first transistor to the eighth transistor in the reset pulse output circuit may be n-channel transistors.

According to an embodiment of the present invention, the set pulse output circuit includes a first transistor to a tenth transistor, a first capacitor, a second capacitor, a first input terminal to a fourth input terminal, a first output terminal, a second output terminal, and a first power supply line to a tenth power supply line. In the set pulse output circuit, a first terminal of the first transistor is connected to the first power supply line, and a second terminal of the first transistor is connected to the first output terminal. A first terminal of the second transistor is connected to the first output terminal, and a second terminal of the second transistor is connected to the second power supply line. A first terminal of the third transistor is connected to the second input terminal, a second terminal of the third transistor is connected to the second output terminal, and a gate of the third transistor is connected to a gate of the first transistor. A first terminal of the fourth transistor is connected to the second output terminal, a second terminal of the fourth transistor is connected to the third power supply line, and a gate of the fourth transistor is connected to a gate of the second transistor. A first terminal of the fifth transistor is connected to a first terminal of the sixth transistor, a second terminal of the fifth transistor is connected to the gate of the first transistor, and a gate of the fifth transistor is connected to the fourth power supply line. A second terminal of the sixth transistor is connected to the fifth power supply line, and a gate of the sixth transistor is connected to the gate of the second transistor. A first terminal of the seventh transistor is connected to the sixth power supply line, a second terminal of the seventh transistor is connected to the first terminal of the sixth transistor, and a gate of the seventh transistor is connected to the third input terminal A first terminal of the eighth transistor is connected to the seventh power supply line, a second terminal of the eighth transistor is connected to the gate of the second transistor, and a gate of the eighth transistor is connected to the first input terminal A first terminal of the ninth transistor is connected to the eighth power supply line, a second terminal of the ninth transistor is connected to the gate of the second transistor, and a gate of the ninth transistor is connected to the fourth input terminal A first terminal of the tenth transistor is connected to the gate of the second transistor, a second terminal of the tenth transistor is connected to the ninth power supply line, and a gate of the tenth transistor is connected to the third input terminal. One terminal of the first capacitor is connected to the gate of the first transistor, and the other terminal of the first capacitor is connected to the first output terminal. One terminal of the second capacitor is connected to the gate of the second transistor, and the other terminal of the second capacitor is connected to the tenth power supply line.

The first transistor to the tenth transistor in the set pulse output circuit may be n-channel transistors.

According to an embodiment of the present invention, a liquid crystal layer in the liquid crystal element may comprise a liquid crystal material exhibiting a blue phase.

According to an embodiment of the present invention, it is possible to provide a liquid crystal display device in which amplitude voltage of an image signal written into a signal line can be decreased.

According to another embodiment of the present invention, it is possible to provide a liquid crystal display device in which voltage of a scan line driver circuit and amplitude voltage of an image signal written into a signal line can be decreased.

According to another embodiment of the present invention, it is possible to provide a liquid crystal display device in which frame inversion driving is performed and amplitude voltage of an image signal written into a signal line can be decreased, and a method for driving the liquid crystal display device.

According to another embodiment of the present invention, it is possible to provide a liquid crystal display device in which frame inversion driving is performed and voltage of a scan line driver circuit and amplitude voltage of an image signal written into a signal line can be decreased, and a method for driving the liquid crystal display device.

According to another embodiment of the present invention, it is possible to provide a liquid crystal display device in which gate line inversion driving is performed and amplitude voltage of an image signal written into a signal line can be decreased, and a method for driving the liquid crystal display device.

According to another embodiment of the present invention, it is possible to provide a liquid crystal display device in which gate line inversion driving is performed and voltage of a scan line driver circuit and amplitude voltage of an image signal written into a signal line can be decreased, and a method for driving the liquid crystal display device.

DETAILED DESCRIPTION OF THE INVENTION

Figure 1:
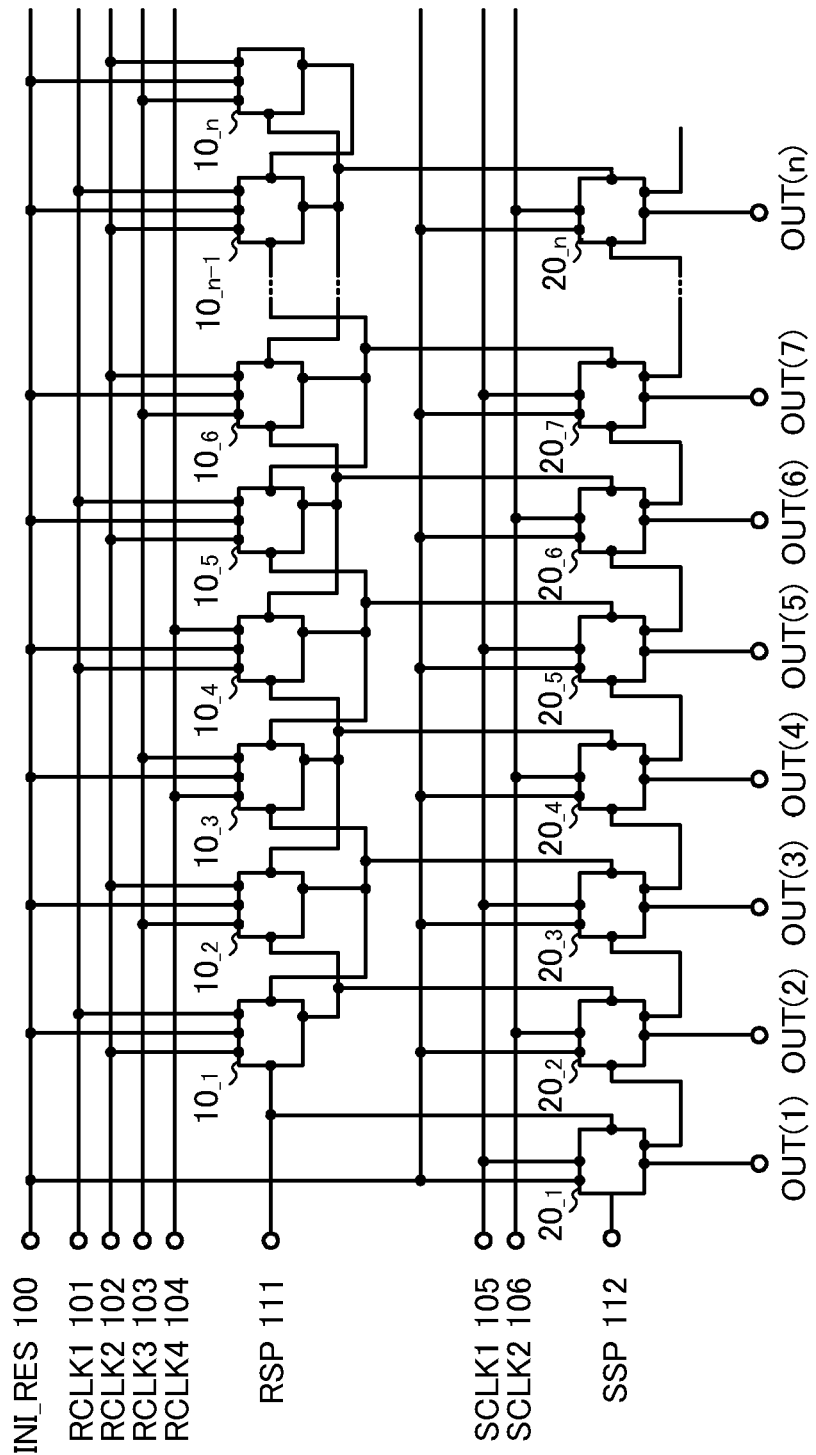
FIG. 1 shows a configuration of a shift register according to an embodiment of the present invention.

Hereinafter, embodiments of the present invention will be described with reference to the accompanying drawings. However, the present invention can be carried out in many different modes, and it is easily understood by those skilled in the art that modes and details thereof can be modified in various ways without departing from the spirit and the scope of the present invention. Therefore, the present invention is not interpreted as being limited to the description of the embodiments below. In a structure of the present invention to be given below, reference numerals denoting the same portions are used in common in different drawings.

Note that the size, the thickness of a layer, the waveform of a signal, and a region of each structure illustrated in the drawings and the like in the embodiments are exaggerated for simplicity in some cases. Therefore, embodiments of the present invention are not limited to such scales.

Note that terms such as "first", "second", "third", to "n-th (n is a natural number)" used in this specification are used only for preventing confusion between components, and thus do not limit the numbers.

Note that in this specification, description "A and B are connected to each other" includes the case where A and B are electrically connected to each other in addition to the case where A and B are directly connected to each other. Specifically, description "A and B are electrically connected to each other" means the case where points existing between A and B can be regarded as the same node considering a circuit operation, for example, the case where A and B are connected to each other with a switching element such as a transistor interposed therebetween and have the same or substantially the same potentials by conduction of the switching element, the case where A and B are connected to each other with a resistor interposed therebetween and a potential difference generated at opposite ends of the resistor does not adversely affect the operation of a circuit including A and B, or the like.

Embodiment 1

In this embodiment, as for a shift register which is provided in a common line driver circuit, examples of a reset pulse output circuit, a set pulse output circuit, and a shift register including the reset pulse output circuit and the set pulse output circuit will be described with reference to FIG. 1, FIGS. 2A and 2B, FIGS. 3A and 3B, FIG. 4, FIGS. 5A and 5B, FIGS. 6A and 6B, FIGS. 7A and 7B, FIGS. 8A and 8B, FIGS. 9A and 9B, FIGS. 10A and 10B, and FIG. 22.

First, the structure of a liquid crystal display device including a common line driver circuit provided with a shift register, which is described in this embodiment, will be described with reference to FIG. 22.

Figure 22:
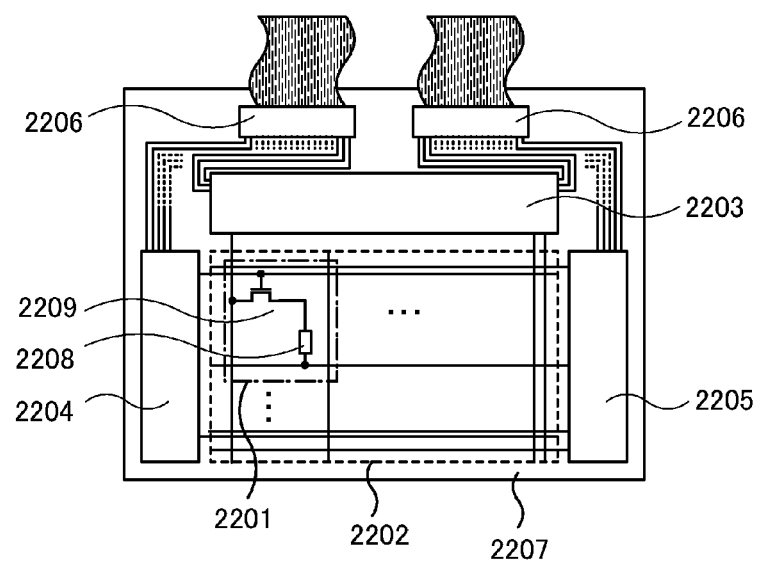
FIG. 22 illustrates a structure of a liquid crystal display device according to an embodiment of the present invention.
Figure 23A:
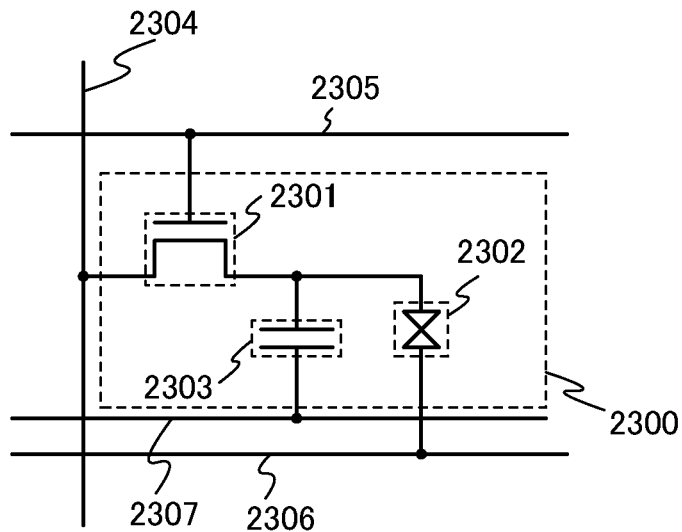
FIG. 23A shows a circuit configuration of a pixel and FIG. 23B is a timing chart of inversion driving.
Figure 23B:
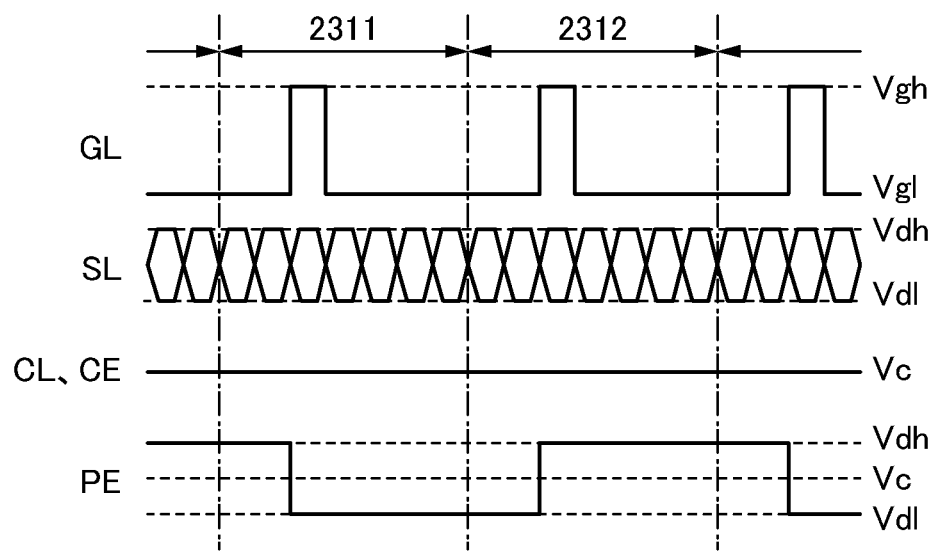

As illustrated in FIG. 22, the liquid crystal display device includes, over a substrate 2207, a pixel portion 2202 in which a plurality of pixels 2201 are arranged (arrayed) in matrix in a row direction and a column direction, and a signal line driver circuit 2203, a scan line driver circuit 2204, and a common line driver circuit 2205 at the periphery of the pixel portion 2202. Signals are supplied to these driver circuits through FPCs 2206.

Note that the signal line driver circuit 2203, the scan line driver circuit 2204, and the common line driver circuit 2205 may be provided over the substrate 2207 where the pixel portion 2202 is formed. When the signal line driver circuit 2203, the scan line driver circuit 2204, and the common line driver circuit 2205 are provided over the substrate 2207 where the pixel portion 2202 is formed, the number of terminals for external connection can be reduced; thus, downsizing of the liquid crystal display device can be achieved.

Each of the plurality of pixels 2201 includes a liquid crystal element 2208 and a transistor 2209 for controlling voltage applied to the liquid crystal element 2208. Note that the arrangement of the pixels 2201 is not limited to the structure illustrated in FIG. 22, and a structure in which pixels are arranged in a straight line or in a zigzag line in a longitudinal direction or a lateral direction can be used.

In this embodiment, by driving the liquid crystal display device by AC driving, degradation (burn-in) of the liquid crystal element can be suppressed. As an AC driving mode, specifically, a frame inversion driving mode or a gate line inversion driving mode can be used.

A liquid crystal material exhibiting a blue phase can be used for a liquid crystal layer included in the liquid crystal element in this embodiment. Liquid crystal exhibiting a blue phase is driven by a horizontal electric field mode. An electrode of the liquid crystal element which is connected to a common line (also referred to as a second electrode or a counter electrode) and an electrode of the liquid crystal element which is connected to the transistor (also referred to as a first electrode or a pixel electrode) are formed over one substrate, whereby the liquid crystal element is formed. Note that without limitation to a liquid crystal element including liquid crystal exhibiting a blue-phase, another type of liquid crystal element including liquid crystal driven by a horizontal electrical field mode or liquid crystal element with a first electrode and a second electrode provided over one substrate can be used for the liquid crystal element in this embodiment.

The common line driver circuit 2205 is provided with a shift register including a reset pulse output circuit and a set pulse output circuit.

Then, the configuration of the shift register including the reset pulse output circuit and the set pulse output circuit will be described below.

The configuration of the shift register in this embodiment will be described with reference to FIG. 1. The shift register includes a first reset pulse output circuit $10\_1$ to an n-th reset pulse output circuit $10\_n$ (n is a natural number of greater than or equal to 2), and a first set pulse output circuit $20\_1$ to an n-th set pulse output circuit $20\_n$.

The reset pulse output circuit will be described with reference to FIGS. 2A and 2B.

Figure 2A:
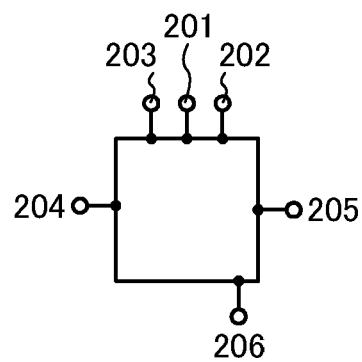
FIGS. 2A and 2B show a reset pulse output circuit according to an embodiment of the present invention.

Each of the first reset pulse output circuit $10_{-1}$ to the n-th reset pulse output circuit $10_{-n}$ includes a first input terminal 201 to a fifth input terminal 205 and a first output terminal 206 (see FIG. 2A).

The first input terminal 201 is connected to a reset initialization signal line 100 to which a reset initialization signal (INI_RES) is input.

Each of the second input terminal 202 and the third input terminal 203 is connected to any of a first signal line 101 to a fourth signal line 104. For example, in FIG. 1, in the first reset pulse output circuit $10_{-1}$, the second input terminal 202 is connected to the first signal line 101, and the third input terminal 203 is connected to the second signal line 102. In addition, in the second reset pulse output circuit $10_{-2}$, the second input terminal 202 is connected to the second signal line 102, and the third input terminal 203 is connected to the third signal line 103.

Note that here, the case where the second signal line 102 and the third signal line 103 are connected to the second input terminal 202 and the third input terminal 203 of the n-th reset pulse signal output circuit $10_{-n}$ respectively, is described. However, which signal lines are connected to which input terminals depends on the value of n. Thus, the configuration described herein is just an example.

A first reset clock signal (RCLK1) is input to the first signal line 101, a second reset clock signal (RCLK2) is input to the second signal line 102, a third reset clock signal (RCLK3) is input to the third signal line 103, and a fourth reset clock signal (RCLK4) is input to the fourth signal line 104.

Note that the reset clock signal (RCLK) is a signal which alternates between an H (high) level and an L (low) level at regular intervals. Here, the first reset clock signal (RCLK1) to the fourth reset clock signal (RCLK4) are delayed by ¼ period sequentially. In this embodiment, by using the first reset clock signal (RCLK1) to the fourth reset clock signal (RCLK4), driving of the first reset pulse output circuit $10_{-1}$ to the n-th reset pulse output circuit $10_{-n}$ is controlled.

The fourth input terminal 204 of the first reset pulse output circuit $10_{-1}$ is connected to a first wiring 111 to which a reset pulse (RSP) is input. Each of the fourth input terminals 204 of the second reset pulse output circuit $10_{-2}$ to the n-th reset pulse output circuit $10_{-n}$ is connected to the first output terminal 206 of the reset pulse output circuit in the previous stage. A signal is output to each of the fourth input terminals 204 of the second reset pulse output circuit $10_{-2}$ to the n-th reset pulse output circuit $10_{-n}$ from the reset pulse output circuit in the previous stage.

Each of the fifth input terminals 205 of the first reset pulse output circuit $10_{-1}$ to the (n−1)-th reset pulse output circuit $10_{-n-1}$ is connected to the first output terminal 206 of the reset pulse output circuit in the subsequent stage. A signal is output to each of the fifth input terminals 205 of the first reset pulse output circuit $10_{-1}$ to the (n−1)-th reset pulse output circuit $10_{-n-1}$ from the reset pulse output circuit in the subsequent stage.

Next, a specific configuration of each of the first reset pulse output circuit $10_{-1}$ to the n-th reset pulse output circuit $10_{-n}$ illustrated in FIG. 1 will be described below.

Each of the first reset pulse output circuit $10_{-1}$ to the n-th reset pulse output circuit $10_{-n}$ includes a transistor 221 to a transistor 229 (hereinafter referred to as a first transistor to a ninth transistor, respectively) (see FIG. 2B). Signals are input to the first transistor 221 to the ninth transistor 229 from a first power supply line 231 to an eighth power supply line 238 as well as the first input terminal 201 to the fifth input terminal 205 and the first output terminal 206 described above.

Hereinafter, description is made with the first transistor 221 to the ninth transistor 229 as n-channel transistors.

A first terminal (one of a source and a drain; the same also applies to the following description) of the first transistor 221 is connected to the first power supply line 231, a second terminal (the other of the source and the drain; the same also applies to the following description) of the first transistor 221 is connected to a first terminal of the fifth transistor 225, and a gate of the first transistor 221 is connected to the fourth input terminal 204. A first terminal of the second transistor 222 is connected to the first terminal of the fifth transistor 225, a second terminal of the second transistor 222 is connected to the second power supply line 232, and a gate of the second transistor 222 is connected to a gate of the fourth transistor 224.

A first terminal of the third transistor 223 is connected to the second input terminal 202, a second terminal of the third transistor 223 is connected to the first output terminal 206, and a gate of the third transistor 223 is connected to a second terminal of the fifth transistor 225. A first terminal of the fourth transistor 224 is connected to the first output terminal 206, and a second terminal of the fourth transistor 224 is connected to the third power supply line 233.

A gate of the fifth transistor 225 is connected to the fourth power supply line 234. A first terminal of the sixth transistor 226 is connected to the fifth power supply line 235, a second terminal of the sixth transistor 226 is connected to the gate of the fourth transistor 224, and a gate of the sixth transistor 226 is connected to the third input terminal 203.

A first terminal of the seventh transistor 227 is connected to the sixth power supply line 236, a second terminal of the seventh transistor 227 is connected to the gate of the fourth transistor 224, and a gate of the seventh transistor 227 is connected to the first input terminal 201. A first terminal of the eighth transistor 228 is connected to the seventh power supply line 237, a second terminal of the eighth transistor 228 is connected to the gate of the fourth transistor 224, and a gate of the eighth transistor 228 is connected to the fifth input terminal 205.

A first terminal of the ninth transistor 229 is connected to the gate of the fourth transistor 224, a second terminal of the ninth transistor 229 is connected to the eighth power supply line 238, and a gate of the ninth transistor 229 is connected to the fourth input terminal 204.

Note that a first potential (e.g., VDD) is supplied to the first power supply line 231 and the fourth power supply line 234 to the seventh power supply line 237, and a second potential (e.g., VSS) is supplied to the second power supply line 232, the third power supply line 233, and the eighth power supply line 238, where VDD>VSS is satisfied.

Each of the first reset clock signal (RCLK1) to the fourth reset clock signal (RCLK4) is a signal which alternates between an H level and an L level at regular intervals, and its potential is VDD when the clock reset signal is at the H level, and VSS when the clock reset signal is at the L level. In addition, here, VSS=0 is satisfied for simplification of the explanation; however, the present invention is not limited thereto. A difference between VDD and VSS is larger than the threshold voltage of the transistors, that is, the difference can bring the transistors into a conduction state (an ON state).

The set pulse output circuit will be described with reference to FIGS. 3A and 3B.

Figure 3A:
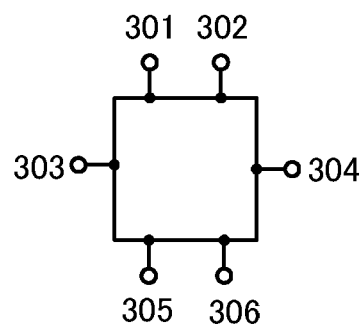
FIGS. 3A and 3B show a set pulse output circuit according to an embodiment of the present invention.
Figure 3B:
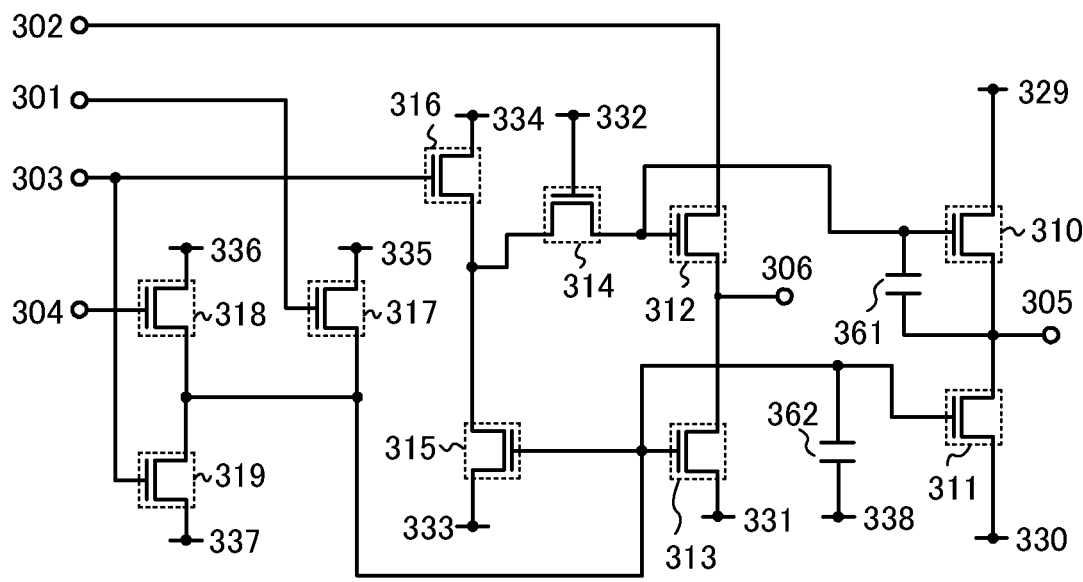

Each of the first set pulse output circuit $20_{-1}$ to the n-th set pulse output circuit $20_{-n}$ includes a sixth input terminal 301 to a ninth input terminal 304, a second output terminal 305, and a third output terminal 306 (see FIG. 3A).

The sixth input terminal 301 is connected to the reset initialization signal line 100 to which the reset initialization signal (INI_RES) is input.

The seventh input terminal 302 is connected to a fifth signal line 105 or a sixth signal line 106. For example, in FIG. 1, the seventh input terminal 302 of the first set pulse output circuit $20_{\_1}$ is connected to the fifth signal line 105. In addition, the seventh input terminal 302 of the second set pulse output circuit $20_{\_2}$ is connected to the sixth signal line 106.

Note that here, the case where the sixth signal line 106 is connected to the seventh input terminal 302 of the n-th set pulse output circuit $20_{\_n}$ is described. However, which signal line is connected to which input terminal depends on the value of n. Thus, the configuration described herein is just an example.

A first set clock signal (SCLK1) is input to the fifth signal line 105, and a second set clock signal (SCLK2) is input to the sixth signal line 106.

Note that the set clock signal (SCLK) is a signal which alternates between an H (high) level and an L (low) level at regular intervals. Here, the first set clock signal (SCLK1) and the second set clock signal (SCLK2) are signals whose polarities are inverted. In this embodiment, by using the first set clock signal (SCLK1) and the second set clock signal (SCLK2), driving of the first set pulse output circuit $20_{\_1}$ to the n-th set pulse output circuit $20_{\_n}$ is controlled.

The eighth input terminal 303 of the first set pulse output circuit $20_{\_1}$ is connected to a second wiring 112 to which a set pulse (SSP) is input. Each of the eighth input terminals 303 of the second set pulse output circuit $20_{\_2}$ to the n-th set pulse output circuit $20_{\_n}$ is connected to the third output terminal 306 of the set pulse output circuit in the previous stage. A signal is output to each of the eighth input terminals 303 of the second set pulse output circuit $20_{\_2}$ to the n-th set pulse output circuit $20_{\_n}$ from the set pulse output circuit in the previous stage.

The ninth input terminal 304 of the first set pulse output circuit $20_{\_1}$ is connected to the first wiring 111. Each of the ninth input terminals 304 of the second set pulse output circuit $20_{\_2}$ to the n-th set pulse output circuit $20_{\_n}$ is connected to the first output terminal 206 of the reset pulse output circuit in the previous stage. A signal is output to each of the ninth input terminals 304 of the second set pulse output circuits $20_{\_2}$ to the n-th set pulse output circuit $20_{\_n}$ from the reset pulse output circuit in the previous stage.

Output signals (OUT(1) to OUT(n)) are output from the second output terminals 305 of the first set pulse output circuit $20_{\_1}$ to the n-th set pulse output circuit $20_{\_n}$, respectively.

Next, a specific configuration of each of the first set pulse output circuit $20_{\_1}$ to the n-th set pulse output circuit $20_{\_n}$ will be described.

Each of the first set pulse output circuit $20_{\_1}$ to the n-th set pulse output circuit $20_{\_n}$ includes a transistor 310 to a transistor 319 (hereinafter referred to as a tenth transistor to a nineteenth transistor, respectively), a capacitor 361 (hereinafter referred to as a first capacitor), and a capacitor 362 (hereinafter referred to as a second capacitor) (see FIG. 3B). Signals are input to the tenth transistor 310 to the nineteenth transistor 319 from a ninth power supply line 329 to a seventeenth power supply line 337 as well as the sixth input terminal 301 to the ninth input terminal 304, the second output terminal 305, and the third output terminal 306 described above.

Hereinafter, description is made with the tenth transistor 310 to the nineteenth transistor 319 as n-channel transistors.

A first terminal of the tenth transistor 310 is connected to the ninth power supply line 329, and a second terminal of the tenth transistor 310 is connected to the second output terminal 305. A first terminal of the eleventh transistor 311 is connected to the second output terminal 305, and a second terminal of the eleventh transistor 311 is connected to the tenth power supply line 330.

A first terminal of the twelfth transistor 312 is connected to the seventh input terminal 302, a second terminal of the twelfth transistor 312 is connected to the third output terminal 306, and a gate of the twelfth transistor 312 is connected to a gate of the tenth transistor 310. A first terminal of the thirteenth transistor 313 is connected to the third output terminal 306, a second terminal of the thirteenth transistor 313 is connected to the eleventh power supply line 331, and a gate of the thirteenth transistor 313 is connected to a gate of the eleventh transistor 311.

A first terminal of the fourteenth transistor 314 is connected to a first terminal of the fifteenth transistor 315, a second terminal of the fourteenth transistor 314 is connected the gate of the tenth transistor 310, and a gate of the fourteenth transistor 314 is connected to the twelfth power supply line 332. A second terminal of the fifteenth transistor 315 is connected to the thirteenth power supply line 333, and a gate of the fifteenth transistor 315 is connected to the gate of the eleventh transistor 311.

A first terminal of the sixteenth transistor 316 is connected to the fourteenth power supply line 334, a second terminal of the sixteenth transistor 316 is connected to the first terminal of the fifteenth transistor 315, and a gate of the sixteenth transistor 316 is connected to the eighth input terminal 303. A first terminal of the seventeenth transistor 317 is connected to the fifteenth power supply line 335, a second terminal of the seventeenth transistor 317 is connected to the gate of the eleventh transistor 311, and a gate of the seventeenth transistor 317 is connected to the sixth input terminal 301.

A first terminal of the eighteenth transistor 318 is connected to the sixteenth power supply line 336, a second terminal of the eighteenth transistor 318 is connected to the gate of the eleventh transistor 311, and a gate of the eighteenth transistor 318 is connected to the ninth input terminal 304. A first terminal of the nineteenth transistor 319 is connected to the gate of the eleventh transistor 311, a second terminal of the nineteenth transistor 319 is connected the seventeenth power supply line 337, and a gate of the nineteenth transistor 319 is connected to the eighth input terminal 303.

One terminal of the first capacitor 361 is connected to the gate of the tenth transistor 310, and the other terminal of the first capacitor 361 is connected to the second output terminal 305. One terminal of the second capacitor 362 is connected to the gate of the eleventh transistor 311, and the other terminal of the second capacitor 362 is connected to the eighteenth power supply line 338.

Note that a first potential (e.g., VDD) is supplied to the twelfth power supply line 332 and the fourteenth power supply line 334 to the sixteenth power supply line 336, and a second potential (e.g., VSS) is supplied to the eleventh power supply line 331, the thirteenth power supply line 333, the seventeenth power supply line 337, and the eighteenth power supply line 338.

Each of the first set clock signal (SCLK1) and the second set clock signal (SCLK2) is a signal which alternates between an H level and an L level at regular intervals, and its potential is VDD when the set clock signal is at the H level, and is VSS when the set clock signal is at the L level. In addition, here, VSS=0 is satisfied for simplification of the explanation; however, the present invention is not limited thereto. A difference between VDD and VSS is larger than the threshold voltage of the transistors, that is, the difference can bring the transistors into a conduction state (an ON state).

In addition, a common potential (TCOMH) is supplied to the ninth power supply line 329, and a common potential (TCOML) is supplied to the tenth power supply line 330, where TCOMH>TCOML. The common line is held at the common potential (TCOMH) or the common potential (TCOML).

Next, the operation of the shift register described with reference to FIG. 1, FIGS. 2A and 2B, and FIGS. 3A and 3B will be described with reference to FIG. 4, FIGS. 5A and 5B, FIGS. 6A and 6B, FIGS. 7A and 7B, FIGS. 8A and 8B, FIGS. 9A and 9B, and FIGS. 10A and 10B, in which a potential of a signal output from the input terminal, the output terminal, or the wiring at an H level is denoted by "H" and a potential of such a signal at an L level is denoted by "L".

Specifically, the operation of the shift register will be described in separate periods: a first period 401 to a sixth period 406 in a timing chart of FIG. 4.

Note that the following description is made with the first transistor 221 to the ninth transistor 229 and the tenth transistor 310 to the nineteenth transistor 319 as n-channel transistors, and the transistors are in a conduction state (ON state) when voltage (Vgs) between the gate and the source exceeds the threshold voltage (Vth).

In the first period 401, the reset pulse (RSP) is at an H level.

In the first period 401, the fourth reset clock signal (RCLK4) and the first set clock signal (SCLK1) are at an H level, and the first reset clock signal (RCLK1) to the third reset clock signal (RCLK3) and the second set clock signal (SCLK2) are at an L level. In addition, the set pulse (SSP) is at an L level.

Since the reset pulse (RSP) is at an H level, in the first reset pulse output circuit 10_₋₁, the first transistor 221 and the ninth transistor 229 whose gates are connected to the fourth input terminal 204 are in a conduction state.

At this time, since the first potential (VDD) is applied to the gate of the fifth transistor 225, the fifth transistor 225 is also in a conduction state. Further, since the first transistor 221 and the fifth transistor 225 are in a conduction state, the third transistor 223 is in a conduction state. Therefore, current flows as indicated by a dashed arrow in FIG. 5A, and an L-level signal is output from the first output terminal 206.

Since the reset pulse (RSP) is at an H level in the first period 401, the eighteenth transistor 318 whose gate is connected to the ninth input terminal 304 of the first set pulse output circuit 20_₋₁ is in a conduction state.

Since the eighteenth transistor 318 is in a conduction state, the eleventh transistor 311, the thirteenth transistor 313, and the fifteenth transistor 315 are in a conduction state. Since the eleventh transistor 311 is in a conduction state, current flows as indicated by a dashed and dotted arrow in FIG. 5B, and the common potential (TCOML) is output as the output signal (OUT(1)) from the second output terminal 305. In addition, since the thirteenth transistor 313 is in a conduction state, current flows as indicated by a dashed arrow in FIG. 5B, and an L-level signal is output from the third output terminal 306.

As described above, in the first period 401, since the reset pulse (RSP) is at an H level, the common potential (TCOML) is output as the output signal (OUT(1)) from the second output terminal 305 of the first set pulse output circuit 20_₋₁.

Next, in the second period 402, the reset pulse (RSP) is at an L level.

In the second period 402, the first reset clock signal (RCLK1) and the second set clock signal (SCLK2) are at an H level, and the second reset clock signal (RCLK2) to the fourth reset clock signal (RCLK4) and the first set clock signal (SCLK1) are at an L level. In addition, the set pulse (SSP) is at an L level.

Since the reset pulse (RSP) is at an L level, in the first reset pulse output circuit 10_₋₁, the first transistor 221 and the ninth transistor 229 whose gates are connected to the fourth input terminal 204 are in a non-conduction state (OFF state).

At this time, a signal input to the fifth input terminal 205 of the first reset pulse output circuit 10_₋₁ from the first output terminal 206 of the second reset pulse output circuit 10_₋₂ is at an L level, so that the eighth transistor 228 is in a non-conduction state. Since the eighth transistor 228 and the ninth transistor 229 are in a non-conduction state, the second transistor 222 and the fourth transistor 224 remain in a non-conduction state. In addition, since the first transistor 221 is in a non-conduction state, the third transistor 223 remains in a conduction state. Thus, current flows as indicated by a dashed arrow in FIG. 6A, and an H-level signal is output from the first output terminal 206.

In addition, since the reset pulse (RSP) is at an L level in the second period 402, the eighteenth transistor 318 whose gate is connected to the ninth input terminal 304 of the first set pulse output circuit 20_₋₁ is in a non-conduction state.

At this time, since the set pulse (SSP) input to the eighth input terminal 303 is at an L level, the sixteenth transistor 316 and the nineteenth transistor 319 are also in a non-conduction state. Since the eighteenth transistor 318 and the nineteenth transistor 319 are in a non-conduction state, the eleventh transistor 311, the thirteenth transistor 313, and the fifteenth transistor 315 remain in a conduction state. With the eleventh transistor 311 in a conduction state, current flows as indicated by a dashed and dotted arrow in FIG. 6B, and the common potential (TCOML) is output from the second output terminal 305. Further, with the thirteenth transistor 313 in a conduction state, current flows as indicated by a dashed arrow in FIG. 6B, and an L-level signal is output from the third output terminal 306.

In addition, since an H-level signal is output from the first output terminal 206 of the first reset pulse output circuit 10_₋₁, in the second reset pulse output circuit 10_₋₂, the first potential (VDD) is applied to the gate of the first transistor 221 and the gate of the ninth transistor 229 from the fourth input terminal 204, so that the first transistor 221 and the ninth transistor 229 are in a conduction state.

At this time, since the first potential (VDD) is applied to the gate of the fifth transistor 225, the fifth transistor 225 is also in a conduction state. Further, since the first transistor 221 and the fifth transistor 225 are in a conduction state, the third transistor 223 is in a conduction state. Therefore, current flows as indicated by a dashed arrow in FIG. 7A, and an L-level signal is output from the first output terminal 206.

In addition, since a signal output from the first output terminal 206 of the first reset pulse output circuit 10_₋₁ has the first potential (VDD) in the second period 402, the eighteenth transistor 318 whose gate is connected to the ninth input terminal 304 of the second set pulse output circuit 20_₋₂ is in a conduction state.

Since the eighteenth transistor 318 is in a conduction state, the eleventh transistor 311, the thirteenth transistor 303, and the fifteenth transistor 315 are in a conduction state. Since the eleventh transistor 311 is in a conduction state, current flows as indicated by a dashed and dotted arrow in FIG. 7B, and the common potential (TCOML) is output from the second output terminal 305 as the output signal (OUT(2)). In addition, since the thirteenth transistor 313 is in a conduction state, current flows as indicated by a dashed arrow in FIG. 7B, and an L-level signal is output from the third output terminal 306.

As described above, in the second period 402, the common potential (TCOML) is output as the output signal (OUT(2)) from the second output terminal 305 of the second set pulse output circuit 20_2.

In addition, in the third period 403, the common potential (TCOML) is output sequentially as the output signals (OUT (3) to OUT(n)) from the second output terminals 305 of the third set pulse output circuit 20_3 to the n-th set pulse output circuit 20_n, in a manner similar to those in the first period 401 and the second period 402.

Next, in the fourth period 404, the set pulse (SSP) is at an H level.

In the fourth period 404, the first reset clock signal (RCLK1) and the second set clock signal (SCLK2) are at an H level, and the second reset clock signal (RCLK2) to the fourth reset clock signal (RCLK4) and the first set clock signal (SCLK1) are at an L level. In addition, the reset pulse (RSP) is at an L level.

Figure 8A:
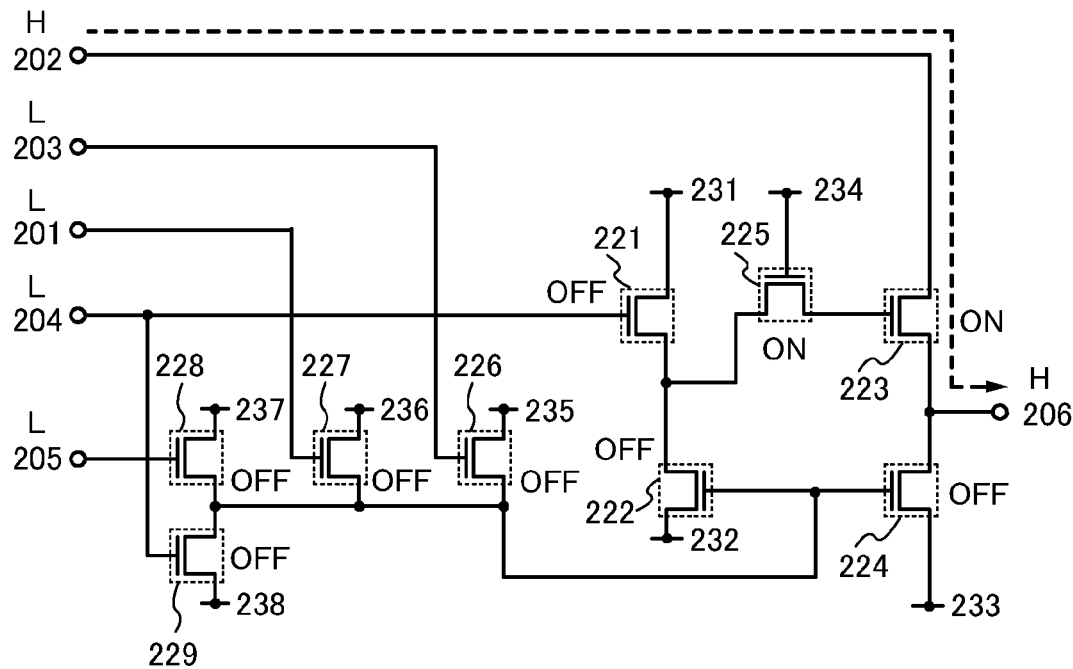
FIGS. 8A and 8B each show an operation of a shift register according to an embodiment of the present invention.
Figure 8B:
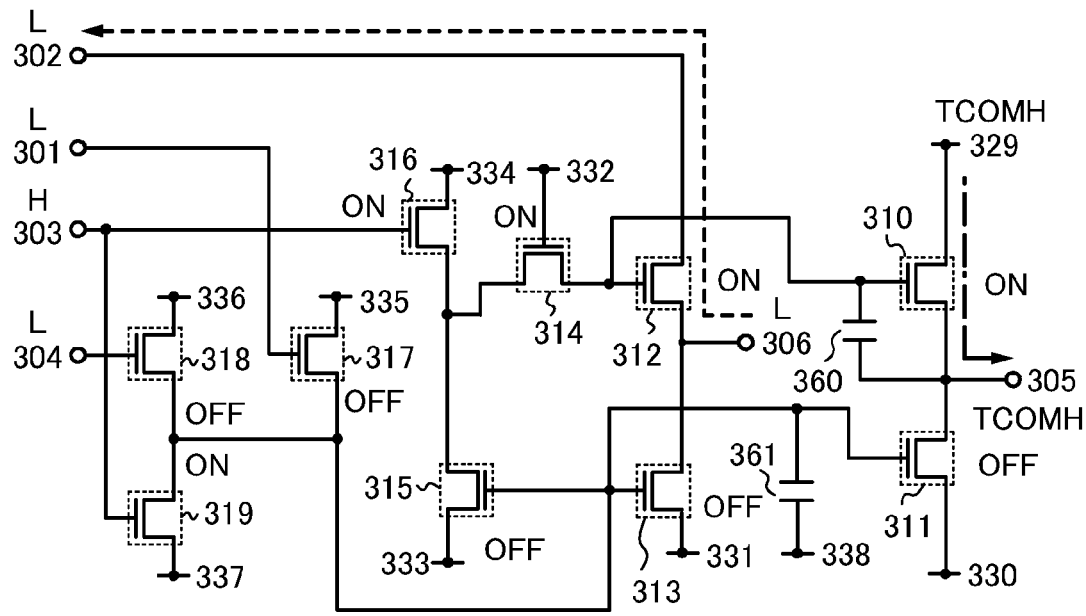

Therefore, since the first transistor 221, the second transistor 222, and the fourth transistor 224 are in a non-conduction state, the third transistor 223 remains in a conduction state, and the first potential (VDD) is output from the first output terminal 206 (see FIG. 8A).

In addition, since the set pulse (SSP) is at an H level, in the first set pulse output circuit 20_1, the sixteenth transistor 316 and the nineteenth transistor 319 whose gates are connected to the eighth input terminal 303 are in a conduction state.

At this time, since the first potential (VDD) is applied to the gate of the fourteenth transistor 314, the fourteenth transistor 314 is also in a conduction state. With the sixteenth transistor 316 and the fourteenth transistor 314 in a conduction state, the tenth transistor 310 and the twelfth transistor 312 are in a conduction state. Since the tenth transistor 310 is in a conduction state, current flows as indicated by a dashed and dotted arrow in FIG. 8B, and the common potential (TCOMH) is output as the output signal (OUT(1)) from the second output terminal 305. In addition, since the twelfth transistor 312 is in a conduction state, current flows as indicated by a dashed arrow in FIG. 8B, and an L-level signal is output from the third output terminal 306.

As described above, in the fourth period 404, since the set pulse (SSP) is at an H level, the common potential (TCOMH) is output as the output signal (OUT(1)) from the second output terminal 305 of the first set pulse output circuit 20_1.

Next, in the fifth period 405, the set pulse (SSP) is at an L level.

In the fifth period 405, the second reset clock signal (RCLK2) and the first set clock signal (SCLK1) are at an H level, and the first reset clock signal (RCLK1), the third reset clock signal (RCLK3), the fourth reset clock signal (RCLK4), and the second set clock signal (SCLK2) are at an L level. In addition, the reset pulse (RSP) is at an L level.

In the first reset pulse output circuit 10_1, since the second reset clock signal (RCLK2) supplied to the third input terminal 203 is at an H level, the sixth transistor 226 is in a conduction state. The sixth transistor 226 is in a conduction state, so that the second transistor 222 and the fourth transistor 224 are in a conduction state. Since the fourth transistor 224 is in a conduction state, current flows as indicated by a dashed arrow in FIG. 9A, and an L-level signal is output from the first output terminal 206.

In addition, since the set pulse (SSP) is at an L level in the fifth period 405, the sixteenth transistor 316 and the nineteenth transistor 319 whose gates are connected to the eighth input terminal 303 are in a non-conduction state in the first set pulse output circuit 20_1. Therefore, the tenth transistor 310 and the twelfth transistor 312 remain in a conduction state.

Figure 9A:
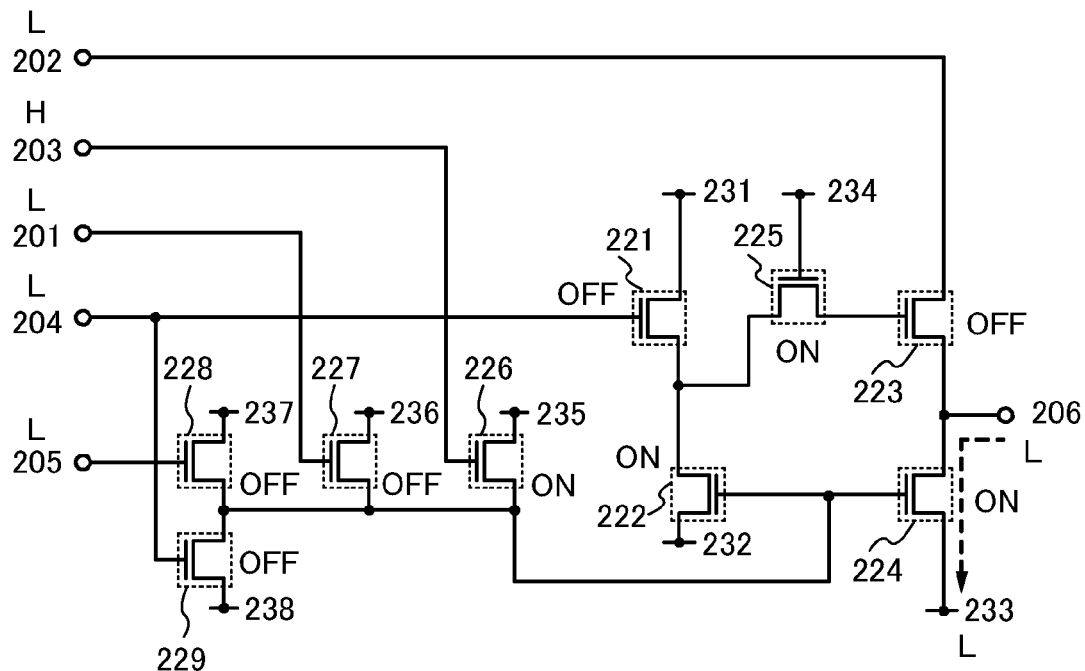
FIGS. 9A and 9B each show an operation of a shift register according to an embodiment of the present invention.
Figure 9B:
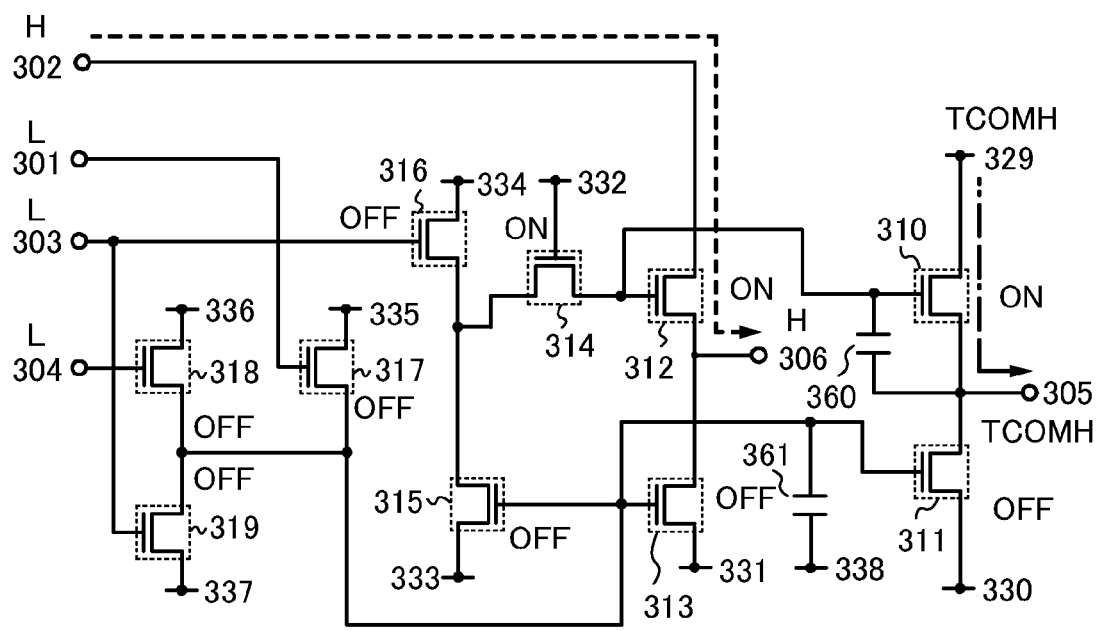

Since the tenth transistor 310 is in a conduction state, current flows as indicated by a dashed and dotted arrow in FIG. 9B, and the common potential (TCOMH) is output as the output signal (OUT(1)) from the second output terminal 305. In addition, since the twelfth transistor 312 is in a conduction state, current flows as indicated by a dashed arrow in FIG. 9B, and an H-level signal is output from the third output terminal 306.

In addition, since an L-level signal is output from the first output terminal 206 of the first reset pulse output circuit 10_1, in the second reset pulse output circuit 10_2, the second potential (VSS) is applied to the gate of the first transistor 221 and the gate of the ninth transistor 229 from the fourth input terminal 204, so that the first transistor 221 and the ninth transistor 229 are in a non-conduction state.

Figure 10A:
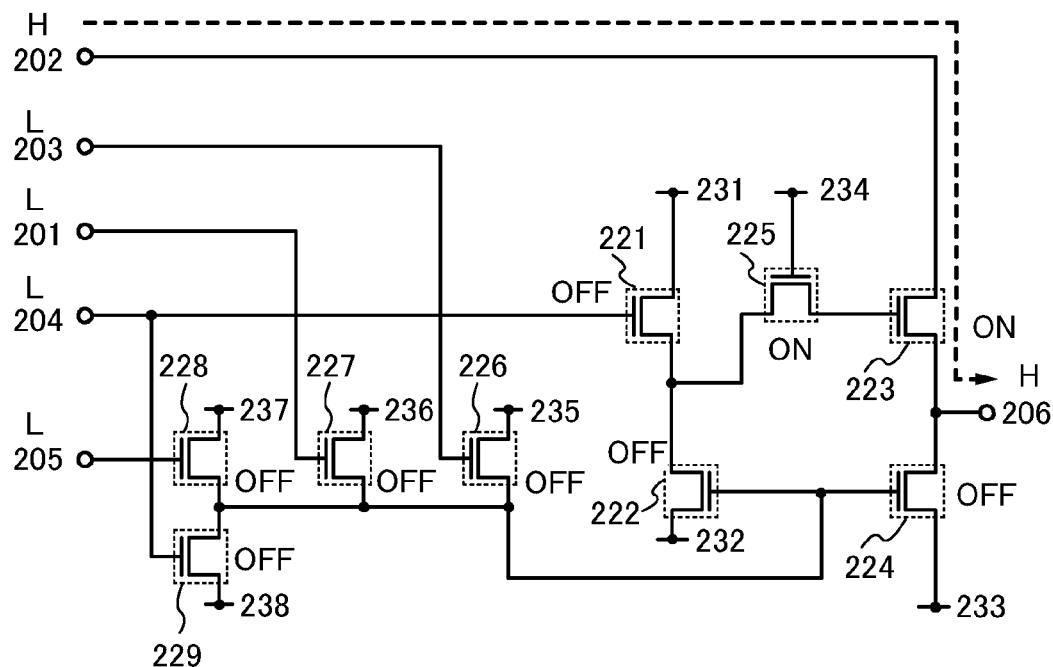
FIGS. 10A and 10B each show an operation of a shift register according to an embodiment of the present invention.
Figure 10B:
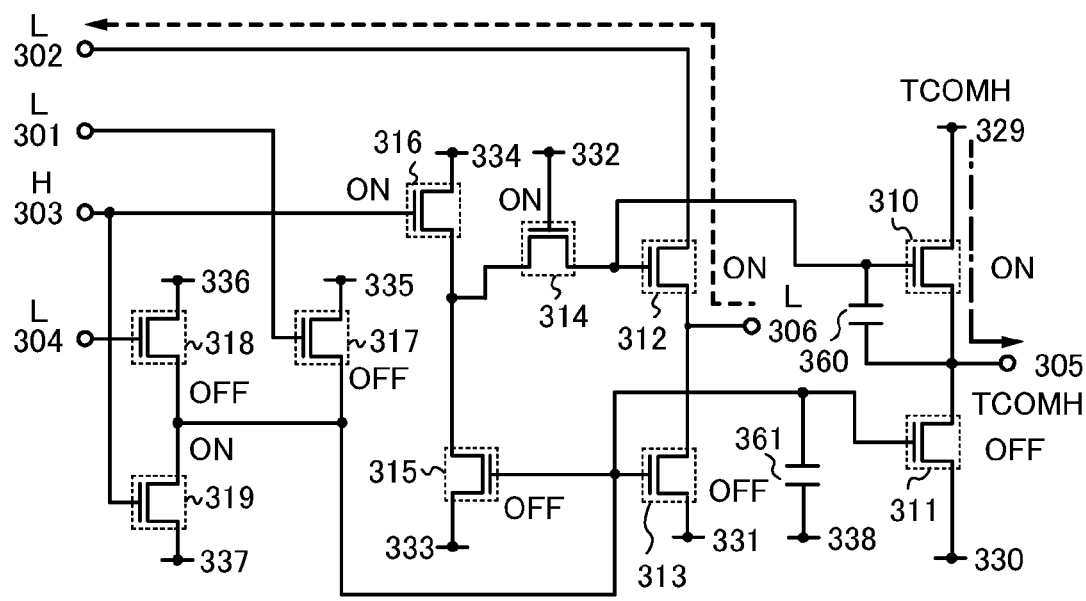

In addition, since the first transistor 221, the second transistor 222, and the fourth transistor 224 are in a non-conduction state, the third transistor 223 remains in a conduction state, and the first potential (VDD) is output from the first output terminal 206 (see FIG. 10A).

In addition, since a signal output from the third output terminal 306 of the first set pulse output circuit 20_1 has the first potential (VDD) in the fifth period 405, the sixteenth transistor 316 and the nineteenth transistor 319 whose gates are connected to the eighth input terminal 303 of the second set pulse output circuit 20_2 are in a conduction state. In addition, since the first potential (VDD) is applied to the gate of the fourteenth transistor 314, the fourteenth transistor 314 is in a conduction state. With the sixteenth transistor 316 and the fourteenth transistor 314 in a conduction state, the tenth transistor 310 and the twelfth transistor 312 are in a conduction state. Since the tenth transistor 310 is in a conduction state, current flows as indicated by a dashed and dotted arrow in FIG. 10B, and the common potential (TCOMH) is output from the second output terminal 305. In addition, since the twelfth transistor 312 is in a conduction state, current flows as indicated by a dashed arrow in FIG. 10B, and the second potential (VSS) is output from the third output terminal 306.

As described above, in the fifth period 405, the common potential (TCOMH) is output as the output signal (OUT(2)) from the second output terminal 305 of the second set pulse output circuit 20_2.

In addition, in the sixth period 406, the common potential (TCOMH) is output sequentially as the output signals (OUT (3)) to (OUT(n)) from the second output terminals 305 of the third set pulse output circuit 20_3 to the n-th set pulse output circuit 20_n in a manner similar to those in the fourth period 404 and the fifth period 405.

In the common line driver circuit, amplitude voltage of an image signal written into signal lines (SL$_1$ to SL$_n$) can be decreased by performing frame inversion driving and by synchronizing the timing at which the common potential is output from the shift register described in this embodiment with the timing at which scan lines (GL$_1$ to GL$_n$) are selected in a pixel portion.

Since the amplitude voltage of the image signal can be decreased, power consumption of the liquid crystal display device can be reduced and the margin of the withstand voltage of the transistor which drives the liquid crystal element can be small.

Amplitude voltage of the image signal and the voltage of the scan line driver circuit can be decreased, whereby power consumption of the liquid crystal display device can be reduced.

This embodiment can be implemented in appropriate combination with the structures described in other embodiments.

Embodiment 2

In this embodiment, the configuration of a shift register provided in a common line driver circuit, which is different from that in Embodiment 1, will be described.

The configuration of the shift register in this embodiment will be described with reference to FIG. 11. The shift register includes a first reset pulse output circuit $30\_1$ to an n-th reset pulse output circuit $30\_n$ (n is a natural number of greater than or equal to 2), and a first set pulse output circuit $20\_1$ to an n-th set pulse output circuit $20\_n$.

The reset pulse output circuit will be described with reference to FIGS. 12A and 12B.

In Embodiment 1, as shown in FIG. 1, each of the fifth input terminals 205 of the first reset pulse output circuit $10\_1$ to an (n−1)-th reset pulse output circuit $10\_1$ (n is a natural number of greater than or equal to 2) is connected to the first output terminal 206 of the reset pulse output circuit in the subsequent stage. In this embodiment, as shown in FIG. 11, each of the first reset pulse output circuit $30\_1$ to the (n−1)-th reset pulse output circuit $30\_{n-1}$ (n is a natural number of greater than or equal to 2) does not include a fifth input terminal.

Figure 12A:
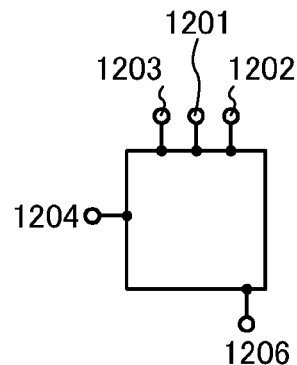
FIGS. 12A and 12B show a reset pulse output circuit according to an embodiment of the present invention.

Specifically, each of the first reset pulse output circuit $30\_1$ to the n-th reset pulse output circuit $30\_a$ includes a first input terminal 1201 to a fourth input terminal 1204 and a first output terminal 1206 (see FIG. 12A).

The first input terminal 1201 is connected to a reset initialization signal line 100 to which a reset initialization signal (INI_RES) is input.

Each of the second input terminal 1202 and the third input terminal 1203 is connected to any of a first signal line 101 to a fourth signal line 104. For example, in FIG. 11, in the first reset pulse output circuit $30\_1$, the second input terminal 1202 is connected to the first signal line 101, and the third input terminal 1203 is connected to the second signal line 102. In addition, in the second reset pulse output circuit $30\_2$, the second input terminal 1202 is connected to the second signal line 102, and the third input terminal 1203 is connected to the third signal line 103.

Note that here, the case where the second signal line 102 and the third signal line 103 are connected to the second input terminal 1202 and the third input terminal 1203 of the n-th reset pulse output circuit $30\_n$ respectively, is described. However, which signal lines are connected to which input terminals depends on the value of n. Thus, the configuration described herein is just an example.

A first reset clock signal (RCLK1) is input to the first signal line 101, a second reset clock signal (RCLK2) is input to the second signal line 102, a third reset clock signal (RCLK3) is input to the third signal line 103, and a fourth reset clock signal (RCLK4) is input to the fourth signal line 104.

Note that the reset clock signal (RCLK) is a signal which alternates between an H (high) level and an L (low) level at regular intervals. Here, the first reset clock signal (RCLK1) to the fourth reset clock signal (RCLK4) are delayed by ¼ period sequentially. In this embodiment, by using the first reset clock signal (RCLK1) to the fourth reset clock signal (RCLK4), driving of the first reset pulse output circuit $30\_1$ to the n-th reset pulse output circuit $30\_n$ is controlled.

The fourth input terminal 1204 of the first reset pulse output circuit $30\_1$ is connected to a first wiring 111 to which a reset pulse (RSP) is input. Each of the fourth input terminals 1204 of the second reset pulse output circuit $30\_2$ to n-th reset pulse output circuit $30\_n$ is connected to the first output terminal 1206 of the reset pulse output circuit in the previous stage. A signal is output to each of the fourth input terminals 1204 of the second reset pulse output circuit $30\_2$ to the n-th reset pulse output circuit $30\_n$ from the reset pulse output circuit in the previous stage.

Next, a specific configuration of each of the first reset pulse output circuit $30\_1$ to the n-th reset pulse output circuit $30\_n$ illustrated in FIG. 11 will be described below.

Each of the first reset pulse output circuit $30\_1$ to the n-th reset pulse output circuit $30\_n$ includes a transistor 1211 to a transistor 1218 (hereinafter referred to as a first transistor to an eighth transistor, respectively) (see FIG. 12B). Signals are input to the first transistor 1211 to the eighth transistor 1218 from a first power supply line 1221 to a seventh power supply line 1227 as well as the first input terminal 1201 to the fourth input terminal 1204 and the first output terminal 1206 described above.

Hereinafter, description is made with the first transistor 1211 to the eighth transistor 1218 as n-channel transistors.

A first terminal (one of a source and a drain; the same also applies to the following description) of the first transistor 1211 is connected to the first power supply line 1221, and a second terminal (the other of the source and the drain; the same also applies to the following description) of the first transistor 1211 is connected to a first terminal of the fifth transistor 1215, and a gate of the first transistor 1211 is connected to the fourth input terminal 1204. A first terminal of the second transistor 1212 is connected to the first terminal of the fifth transistor 1215, a second terminal of the second transistor 1212 is connected to the second power supply line 1222, and a gate of the fourth transistor 1214 is connected to a gate of the fourth transistor 1214.

A first terminal of the third transistor 1213 is connected to the second input terminal 1202, a second terminal of the third transistor 1213 is connected to the first output terminal 1206, and a gate of the third transistor 1213 is connected to a second terminal of the fifth transistor 1215. A first terminal of the fourth transistor 1214 is connected to the first output terminal 1206, and a second terminal of the fourth transistor 1214 is connected to the third power supply line 1223.

A gate of the fifth transistor 1215 is connected to the fourth power supply line 1224. A first terminal of the sixth transistor 1216 is connected to the fifth power supply line 1225, a second terminal of the sixth transistor 1216 is connected to the gate of the fourth transistor 1214, and a gate of the sixth transistor 1216 is connected to the third input terminal 1203.

A first terminal of the seventh transistor 1217 is connected to the sixth power supply line 1226, a second terminal of the seventh transistor 1217 is connected to the gate of the fourth transistor 1214, and a gate of the seventh transistor 1217 is connected to the first input terminal 1201. A first terminal of the eighth transistor 1218 is connected to the gate of the fourth transistor 1214, a second terminal of the eighth transistor 1218 is connected to the seventh power supply line 1227, and a gate of the eighth transistor 1218 is connected to the fourth input terminal 1204.

Note that a first potential (e.g., VDD) is supplied to the first power supply line 1221, the fourth power supply line 1224, the fifth power supply line 1225, and the sixth power supply line 1226, and a second potential (e.g., VSS) is supplied to the second power supply line 1222, the third power supply line 1223, and the seventh power supply line 1227, where VDD>VSS is satisfied.

In addition, each of the first reset clock signal (RCLK1) to the fourth reset clock signal (RCLK4) is a signal which alternates between an H level and an L level at regular intervals, and its potential is VDD when the reset clock signal is at the H level, and VSS when the reset clock signal is at the L level. In addition, here, VSS=0 is satisfied for simplification of the explanation; however, the present invention is not limited thereto. A difference between VDD and VSS is larger than the threshold voltage of the transistors, that is, the difference can bring the transistors into a conduction state (an ON state).

Each of the first set pulse output circuit $20\_{\_1}$ to the n-th set pulse output circuit $20\_{\_n}$ can employ the configuration described in detail in Embodiment 1 (see FIGS. 3A and 3B), so that the description is omitted here.

In addition, the shift register described in this embodiment can operate in a manner similar to that described in Embodiment 1 (see FIG. 4, FIGS. 5A and 5B, FIGS. 6A and 6B, FIGS. 7A and 7B, FIGS. 8A and 8B, FIGS. 9A and 9B, and FIGS. 10A and 10B), so that the description is omitted here.

In the common line driver circuit, amplitude voltage of an image signal written into signal lines ($SL_1$ to $SL_n$) can be decreased by performing frame inversion driving and by synchronizing the timing at which the common potential is output from the shift register described in this embodiment with the timing at which scan lines ($GL_1$ to GLn) are selected in a pixel portion.

Since the amplitude voltage of the image signal can be decreased, power consumption of the liquid crystal display device can be reduced and the margin of the withstand voltage of the transistor which drives the liquid crystal element can be small.

The amplitude voltage of the image signal written into the signal line and the voltage of the scan line driver circuit can be decreased in frame inversion driving, whereby power consumption of the liquid crystal display device can be reduced.

By employing the reset pulse output circuit described in this embodiment, the number of wirings of the shift register can be reduced and thus the area where the wirings are provided can be reduced, whereby the layout area of the shift register can be reduced. In addition, the smaller number of the wirings can improve the yield of the shift register.

This embodiment can be implemented in appropriate combination with the structures described in other embodiments.

Embodiment 3

In this embodiment, the configuration of a shift register provided in a common line driver circuit, which is different from those in Embodiments 1 and 2, will be described with reference to FIG. 13, FIG. 14, and FIG. 15. In this embodiment, an example in which a first shift register and a second shift register are provided in the common line driver circuit will be described.

First, the configuration of the first shift register including a first reset pulse output circuit and a first set pulse output circuit will be described below.

The configuration of the first shift register in this embodiment will be described with reference to FIG. 13. The first shift register includes a first reset pulse output circuit $40\_{\_1}$ to an (2m−1)-th reset pulse output circuit $40\_{\_2m-1}$ (m is a natural number of greater than or equal to 2), and a first set pulse output circuit $50\_{\_1}$ to an (2m−1)-th set pulse output circuit $50\_{\_2m-1}$ (m is a natural number of greater than or equal to 2).

Figure 13:
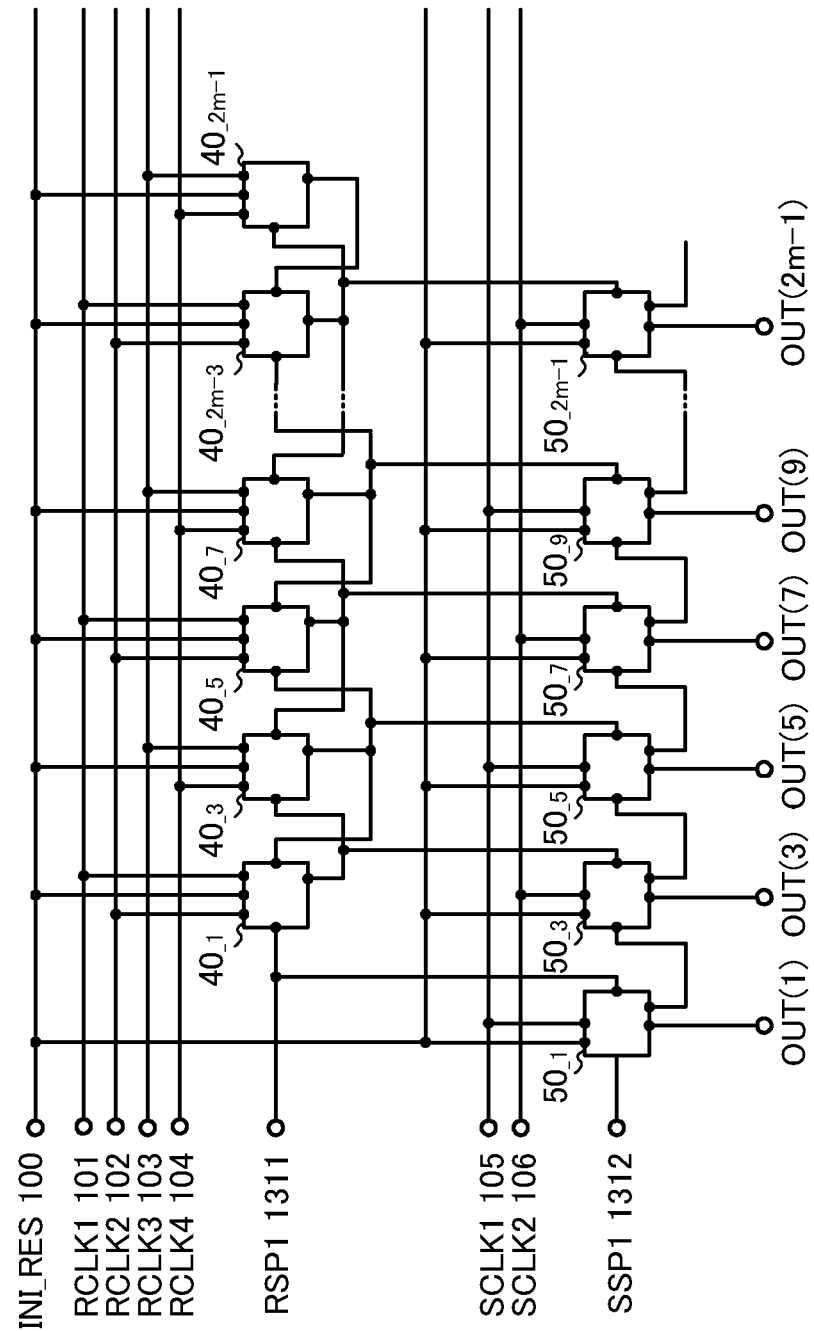
FIG. 13 shows a configuration of a shift register according to an embodiment of the present invention.

In the reset pulse output circuit illustrated in FIG. 13, each of a second input terminal and a third input terminal is connected to any of a first signal line 101 to a fourth signal line 104 in a manner different from that in the reset pulse output circuit described in Embodiment 1 or 2.

Specifically, in FIG. 13, in the first reset pulse output circuit $40\_{\_1}$, a second input terminal 202 is connected to the first signal line 101, and a third input terminal 203 is connected to a second signal line 102. In addition, in a third reset pulse output circuit $40\_{\_3}$, the second input terminal 202 is connected to a third signal line 103, and the third input terminal 203 is connected to the fourth signal line 104.

Note that here, the case where the third signal line 103 and the fourth signal line 104 are connected to the second input terminal 202 and the third input terminal 203 of the (2m−1)-th reset pulse output circuit $40\_{\_2m-1}$ respectively, is described. However, which signal lines are connected to which input terminals depends on the value of m. Thus, the configuration described herein is just an example.

Output signals (OUT(1) to OUT(2m−1)) (m is a natural number of greater than or equal to 2) are output from second output terminals 305 of the first set pulse output circuit $50\_{\_1}$ to the (2m−1)-th set pulse output circuit $50\_{\_2m-1}$, respectively.

Figure 11:
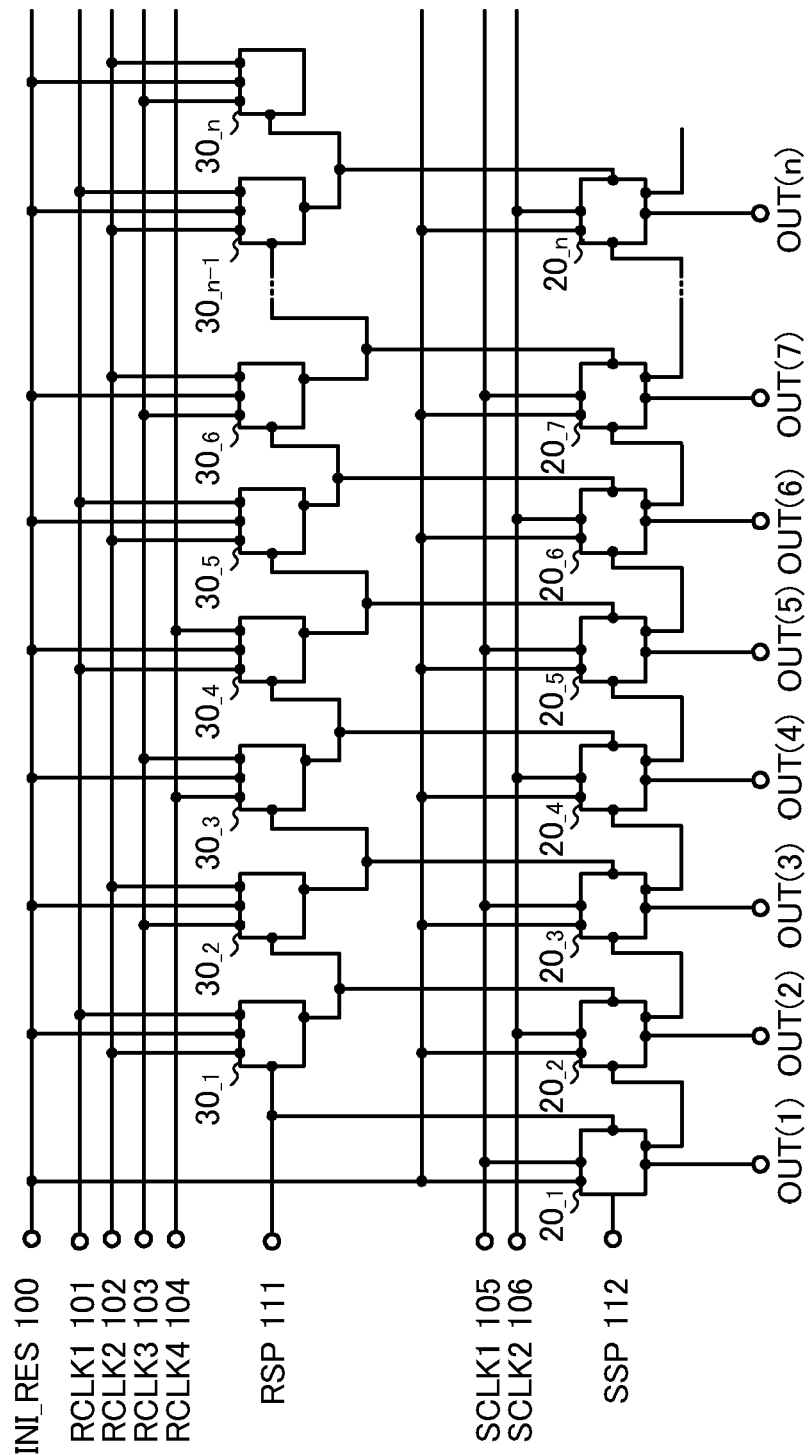
FIG. 11 shows a configuration of a shift register according to an embodiment of the present invention.

A first wiring 1311 and a second wiring 1312 in the first shift register correspond to the first wiring 111 and the second wiring 112 in FIG. 1 or FIG. 11. A first reset pulse (RSP1) is input to the first wiring 1311, and a first set pulse (SSP1) is input to the second wiring 1312.

Then, the configuration of the second shift register including a second reset pulse output circuit and a second set pulse output circuit will be described below.

The configuration of the second shift register in this embodiment will be described with reference to FIG. 14. The second shift register includes a second reset pulse output circuit $40\_{\_2}$ to a 2m-th reset pulse output circuit $40\_{\_2m}$ (m is a natural number of greater than or equal to 2), and a second set pulse output circuit $50\_{\_2}$ to a 2m-th set pulse output circuit $50\_{\_2m}$ (m is a natural number of greater than or equal to 2).

Figure 14:
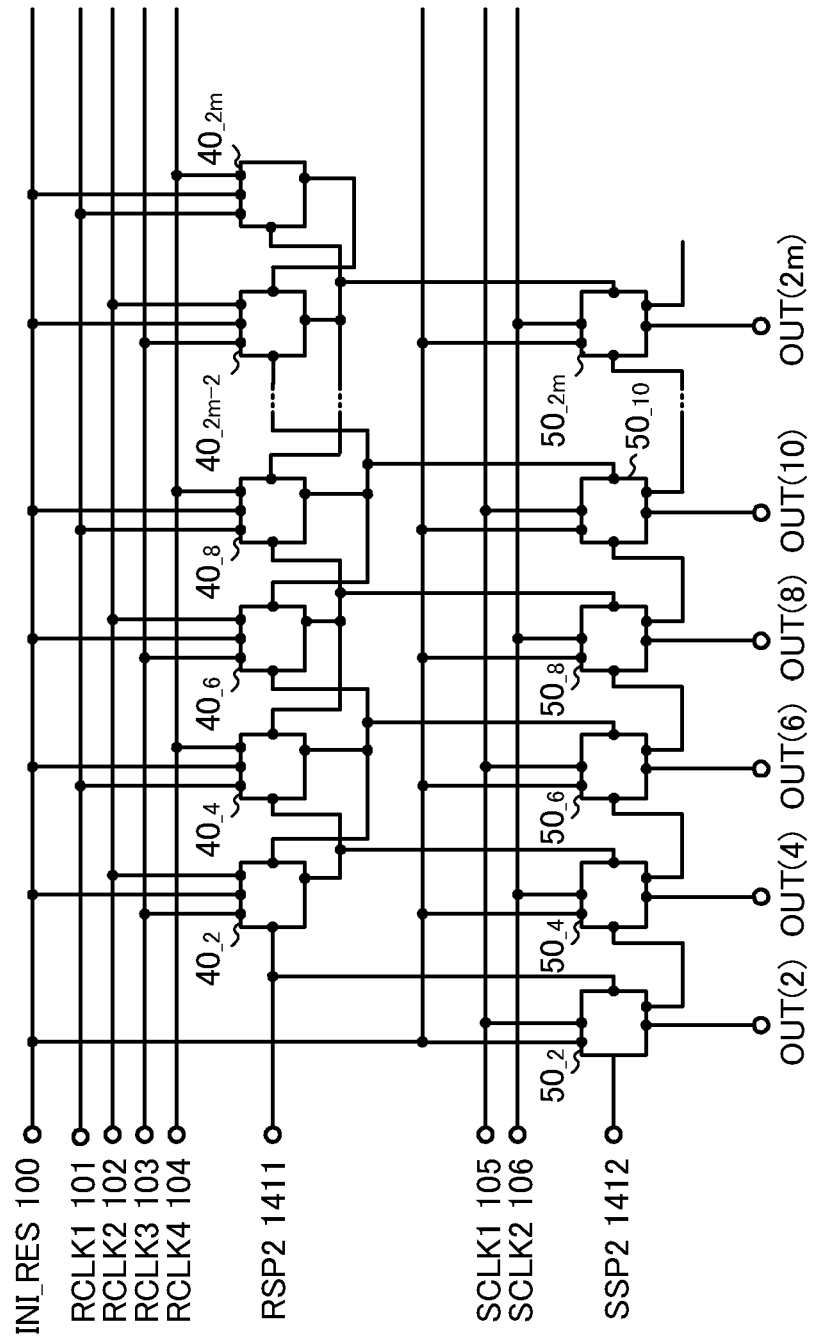
FIG. 14 shows a configuration of a shift register according to an embodiment of the present invention.
Figure 15:
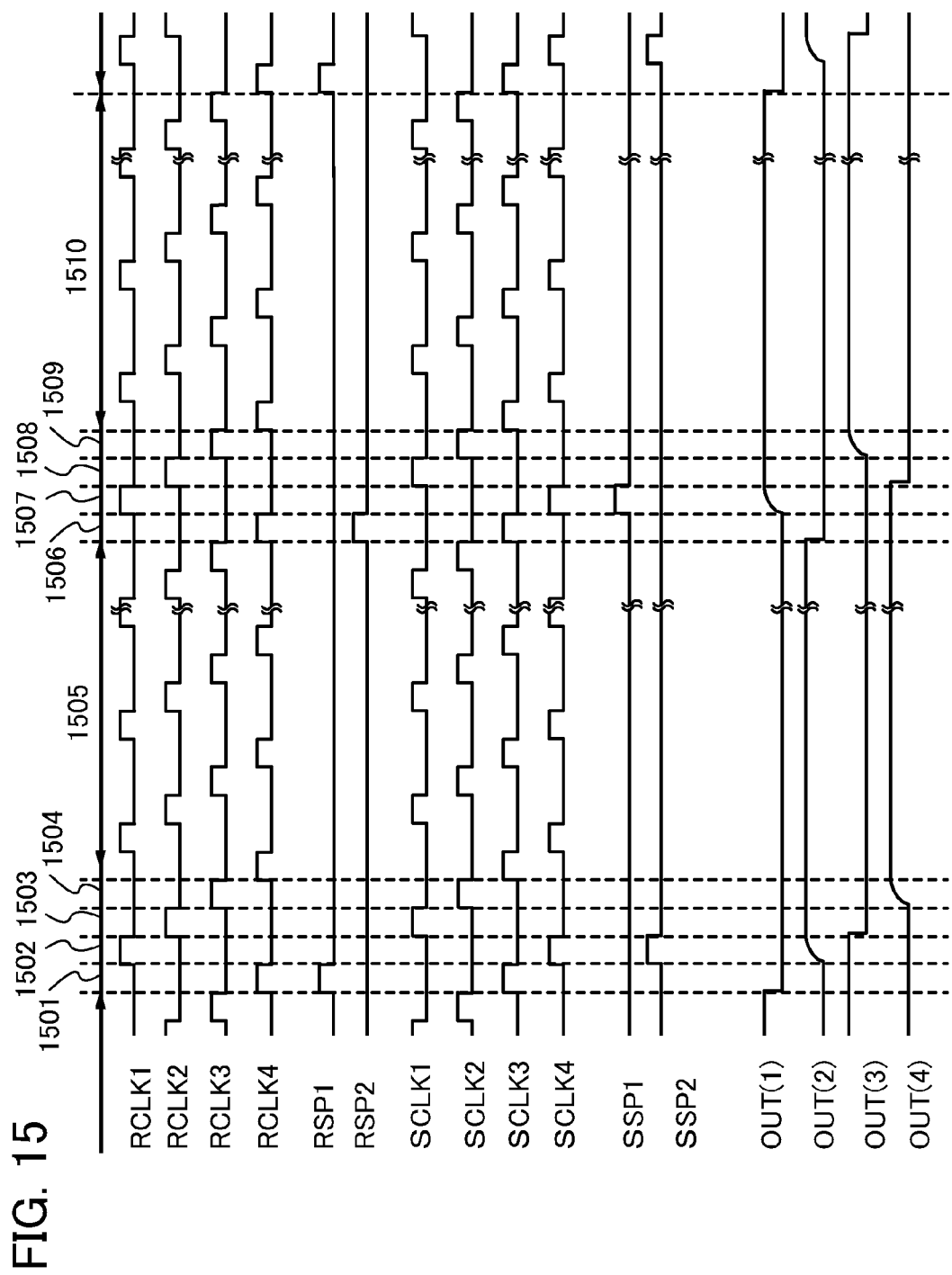
FIG. 15 shows an operation of a shift register according to an embodiment of the present invention.

In the reset pulse output circuit illustrated in FIG. 14, each of a second input terminal and a third input terminal is connected to any of a first signal line 101 to a fourth signal line 104 in a manner different from that in the reset pulse output circuit described in Embodiment 1 or 2.

Specifically, in FIG. 14, in the second reset pulse output circuit $40\_{\_2}$, the second input terminal 202 is connected to a second signal line 102, and the third input terminal 203 is connected to a third signal line 103. In addition, in the fourth reset pulse output circuit $40\_{\_4}$, the second input terminal 202 is connected to the fourth signal line 104, and the third input terminal 203 is connected to the first signal line 101.

Note that here, the case where the fourth signal line 104 and the first signal line 101 are connected to the second input terminal 202 and the third input terminal 203 of the 2m-th reset pulse output circuit $40\_{\_2m}$ respectively, is described. However, which signal lines are connected to which input terminals depends on the value of m. Thus, the configuration described herein is just an example.

Output signals (OUT(1) to OUT(2m)) (m is a natural number of greater than or equal to 2) are output from second output terminals 305 of the second set pulse output circuit $50\_{\_2}$ to the 2m-th set pulse output circuit $50\_{\_2m}$, respectively.

A first wiring 1411 and a second wiring 1412 in the second shift register correspond to the first wiring 111 and the second wiring 112 in FIG. 1 or FIG. 11. A second reset pulse (RSP2) is input to the first wiring 1411, and a second set pulse (SSP2) is input to the second wiring 1412.

Figure 2B:
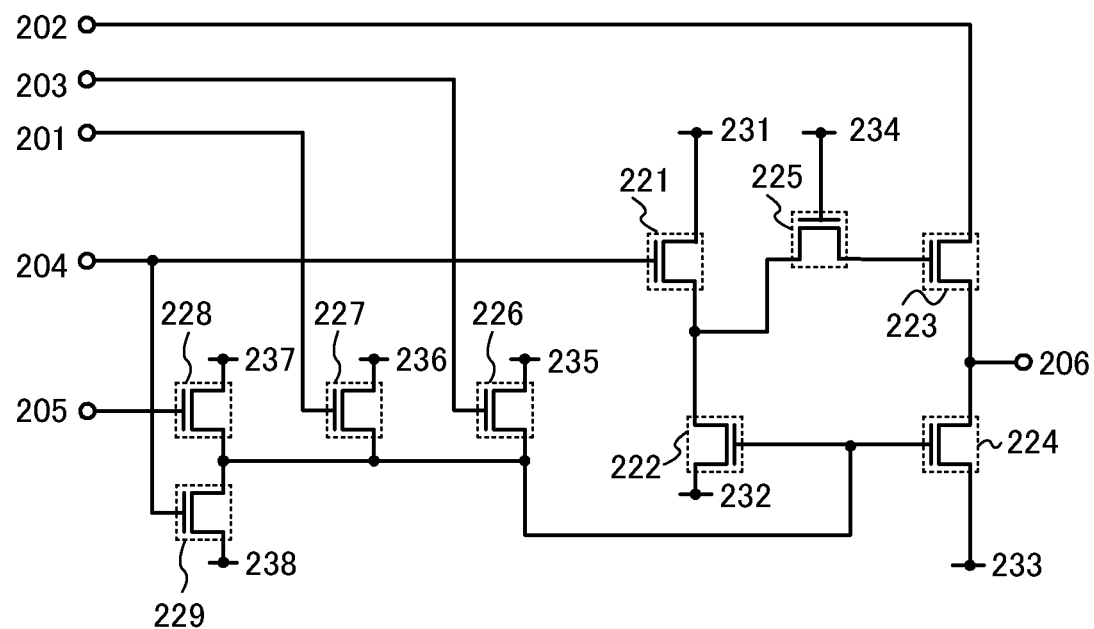
Figure 12B:
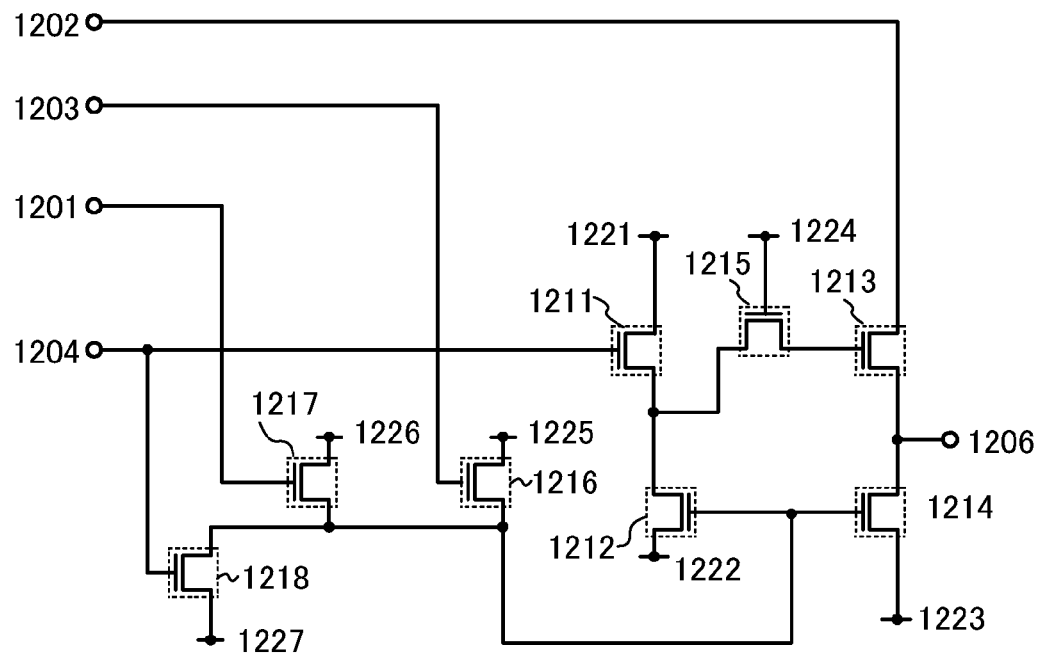

As the reset pulse output circuit included in each of the first and second shift registers, for example, the reset pulse output circuit illustrated in FIGS. 2A and 2B of Embodiment 1 or the reset pulse output circuit illustrated in FIGS. 12A and 12B of Embodiment 2 can be used. In addition, as the set pulse output circuit included in each of the first and second shift registers, for example, the set pulse output circuit illustrated in FIGS.

3A and 3B of Embodiment 1 can be used. Therefore, the specific configurations of the reset pulse output circuit and the set pulse output circuit are not described here.

Next, operations of the first shift register illustrated in FIG. 13 and the second shift register illustrated in FIG. 14 are described with reference to FIG. 15. Specifically, operations of the first shift register illustrated in FIG. 13 and the second shift register illustrated in FIG. 14 will be described in separate periods: a first period 1501 to a tenth period 1510 in a timing chart of FIG. 15.

Note that the following description is made with transistors included in the first shift register and the second shift register as n-channel transistors, and the transistors are in a conduction state (ON state) when voltage (Vgs) between the gate and the source exceeds the threshold voltage (Vth).

Figure 4:
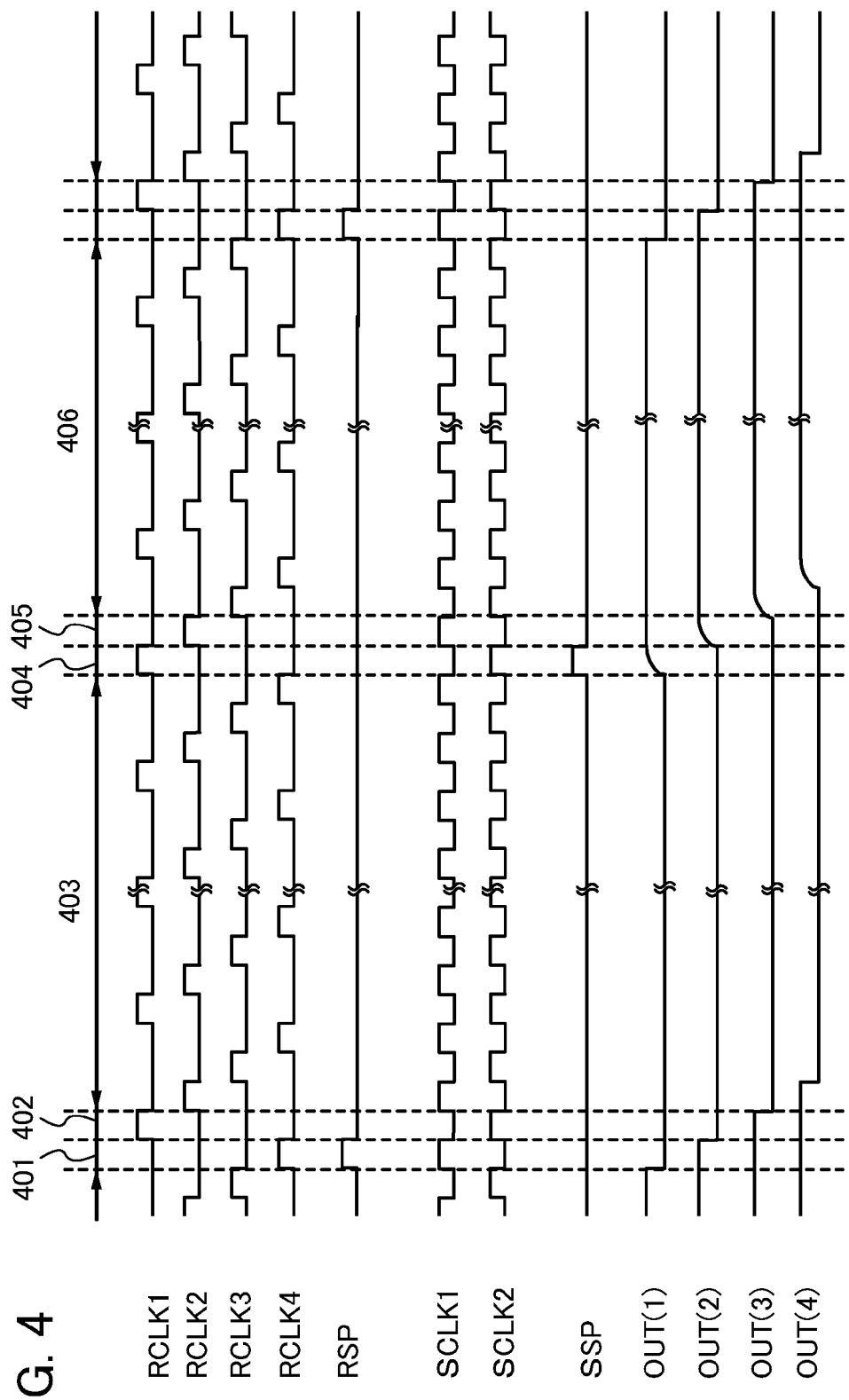
FIG. 4 shows an operation of a shift register according to an embodiment of the present invention.
Figure 5A:
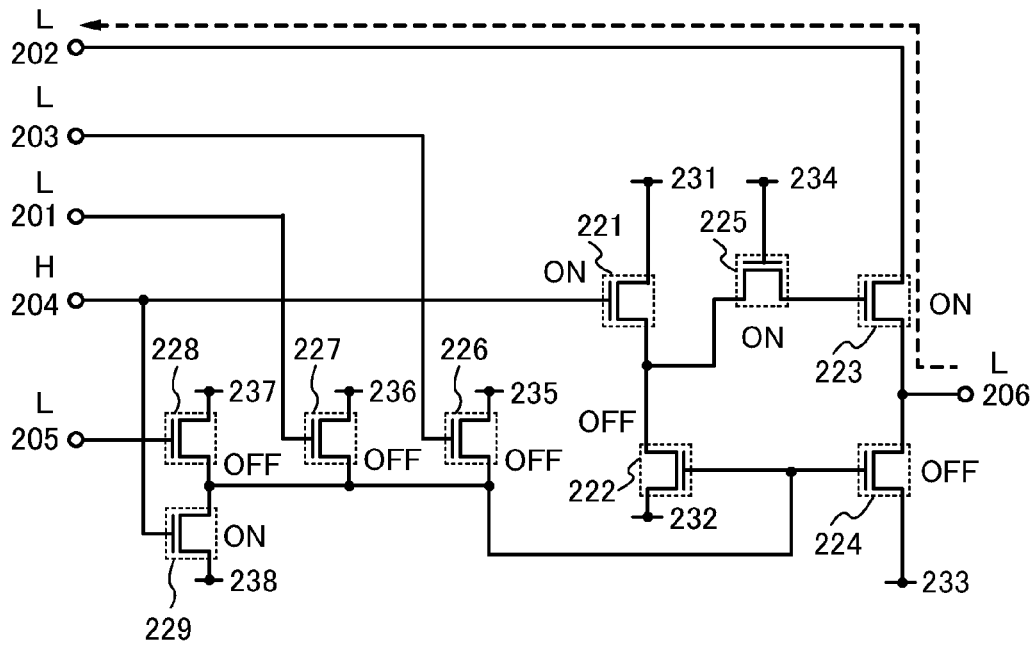
FIGS. 5A and 5B each show an operation of a shift register according to an embodiment of the present invention.
Figure 5B:
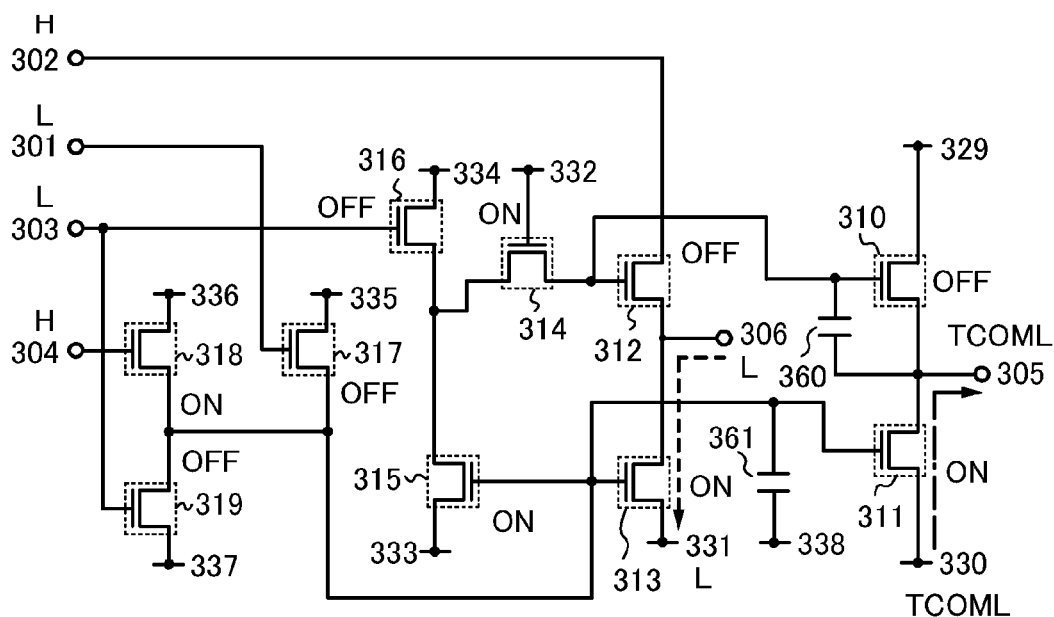
Figure 6A:
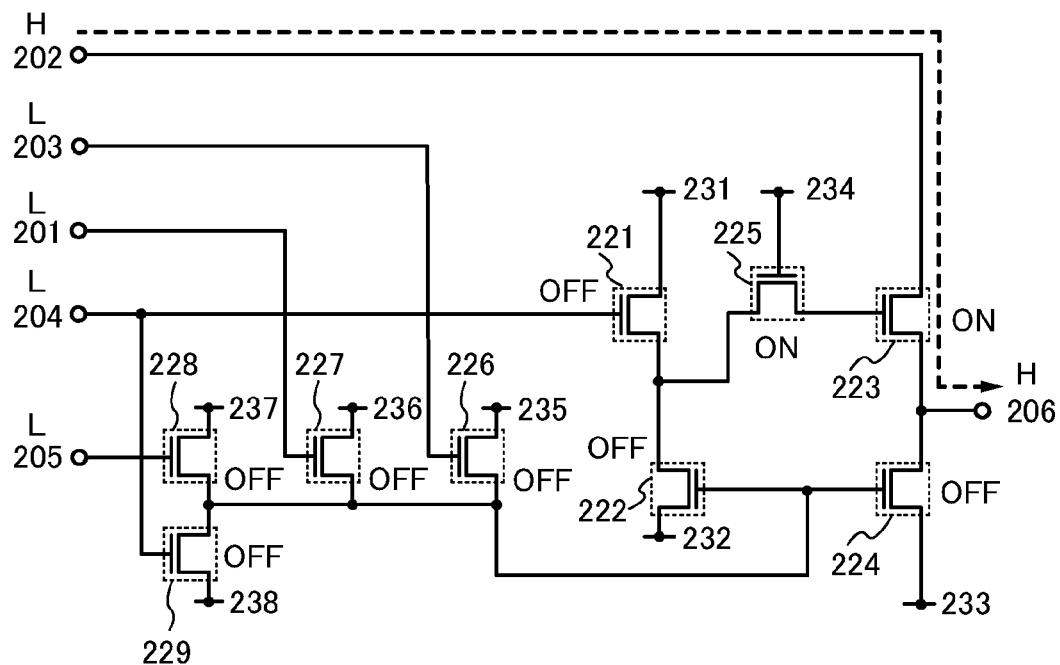
FIGS. 6A and 6B each show an operation of a shift register according to an embodiment of the present invention.
Figure 6B:
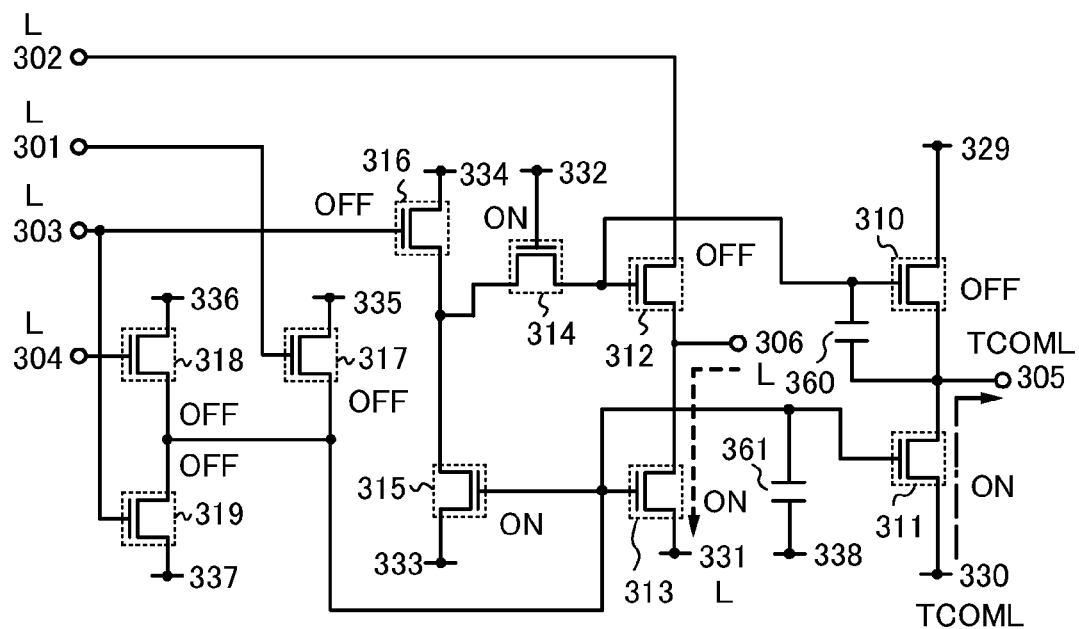
Figure 7A:
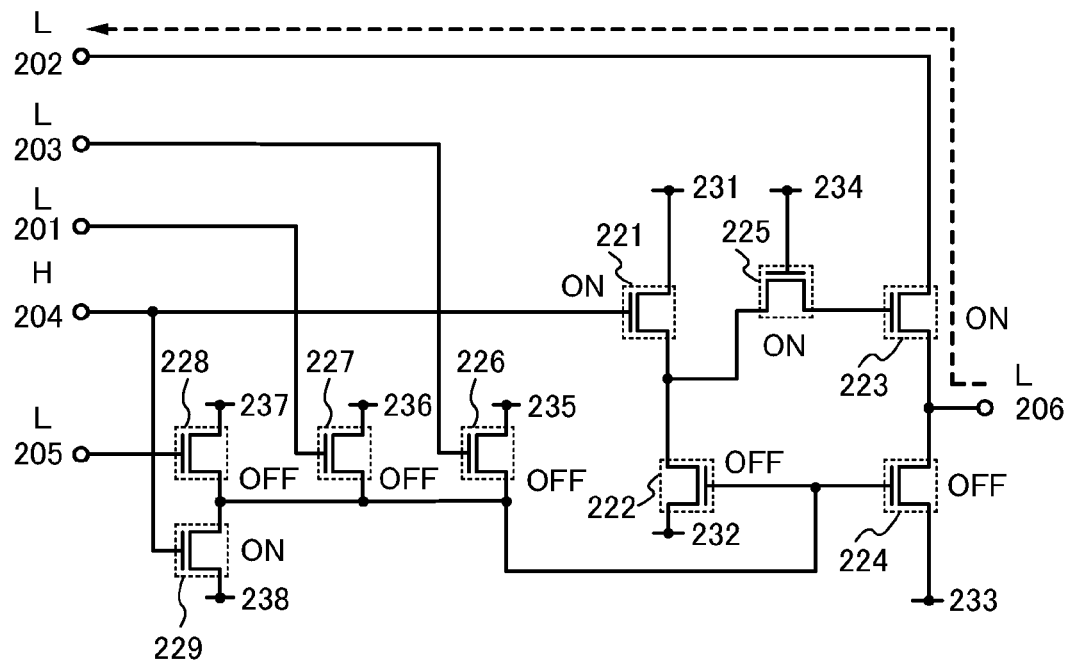
FIGS. 7A and 7B each show an operation of a shift register according to an embodiment of the present invention.
Figure 7B:
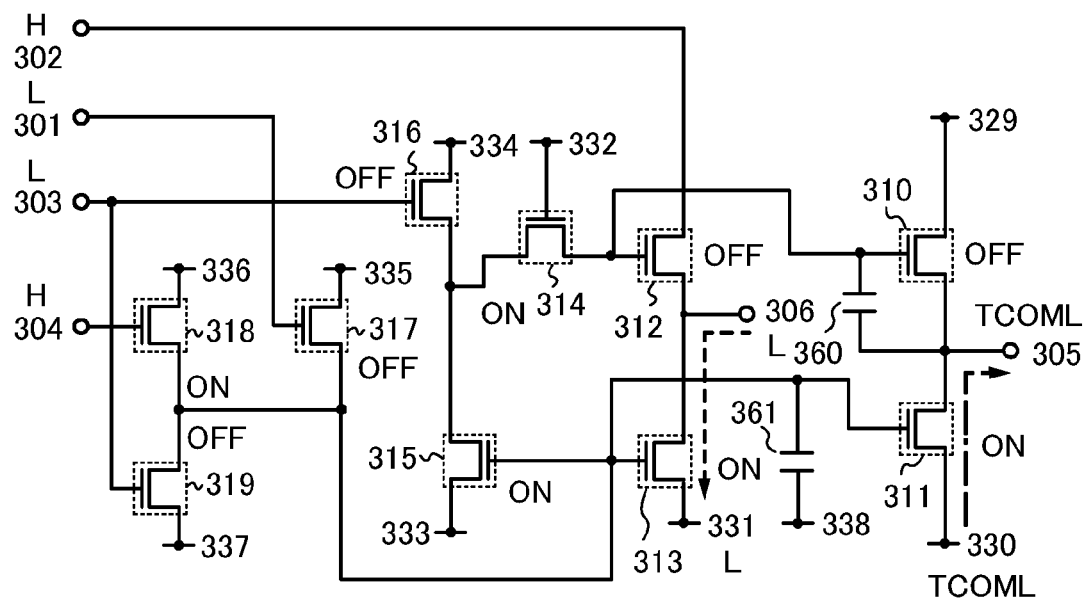

In the first period 1501, the first reset pulse (RSP1) is at an H level, and the first shift register operates in a manner similar to that in the first period 401 in FIG. 4 of Embodiment 1. Specifically, the common potential (TCOML) is output as the output signal (OUT(1)) from the second output terminal 305 of the first set pulse output circuit $50\_1$.

In the second period 1502, the second set pulse (SSP2) is at an H level, and the second shift register operates in a manner similar to that in the fourth period 404 in FIG. 4 of Embodiment 1. Specifically, the common potential (TCOMH) is output as the output signal (OUT(2)) from the second output terminal 305 of the second set pulse output circuit $50\_2$.

In the third period 1503, the first shift register operates in a manner similar to that in the second period 402 in FIG. 4 of Embodiment 1. Specifically, the common potential (TCOML) is output as the output signal (OUT(3)) from the second output terminal 305 of the third set pulse output circuit $50\_3$.

In the fourth period 1504, the second shift register operates in a manner similar to that in the fifth period 405 in FIG. 4 of Embodiment 1. Specifically, the common potential (TCOMH) is output as the output signal (OUT(4)) from the second output terminal 305 of the fourth set pulse output circuit $50\_4$.

In the fifth period 1505, in a manner similar to those in the first period 1501 to the fourth period 1504, the common potential (TCOML) as the output signals (OUT(5) to OUT(2m−1)) (m is a natural number of greater than or equal to 4) and the common potential (TCOMH) as the output signals (OUT(6) to OUT(2m)) (m is a natural number of greater than or equal to 4) are alternately output from the second output terminals 305 of the fifth set pulse output circuit $50\_5$ to the (2m−1)-th set pulse output circuit $50\_{2m-1}$ (m is a natural number of greater than or equal to 4) and the second output terminals 305 of the sixth set pulse output circuit $50\_6$ to the 2m-th set pulse output circuit $50\_2$ (m is a natural number of greater than or equal to 4).

In the sixth period 1506, the second reset pulse (RSP2) is at an H level, and the second shift register operates in a manner similar to that in the first period 401 in FIG. 4 of Embodiment 1. Specifically, the common potential (TCOML) is output as the output signal (OUT(2)) from the second output terminal 305 of the second set pulse output circuit $50\_2$.

In the seventh period 1507, the first set pulse (SSP1) is at an H level, and the first shift register operates in a manner similar to that in the fourth period 404 in FIG. 4 of Embodiment 1. Specifically, the common potential (TCOMH) is output as the output signal (OUT(1)) from the second output terminal 305 of the first set pulse output circuit $50\_1$.

In the eighth period 1508, the second shift register operates in a manner similar to that in the second period 402 in FIG. 4 of Embodiment 1. Specifically, the common potential (TCOML) is output as the output signal (OUT(4)) from the second output terminal 305 of the fourth set pulse output circuit $50\_4$.

In the ninth period 1509, the first shift register operates in a manner similar to that in the fifth period 405 in FIG. 4 of Embodiment 1. Specifically, the common potential (TCOMH) is output as the output signal (OUT(3)) from the second output terminal 305 of the third set pulse output circuit $50\_3$.

In the tenth period 1510, in a manner similar to those in the sixth period 1506 to the ninth period 1509, the common potential (TCOMH) as the output signals (OUT(5) to OUT(2m−1)) (m is a natural number of greater than or equal to 4) and the common potential (TCOML) as the output signals (OUT(6) to OUT(2m)) (m is a natural number of greater than or equal to 4) are alternately output from the second output terminals 305 of the fifth set pulse output circuit $50\_5$ to the (2m−1)-th set pulse output circuit $50\_{2m-1}$ (m is a natural number of greater than or equal to 4) and the second output terminals 305 of the sixth set pulse output circuit $50\_6$ to the 2m-th set pulse output circuit $50\_2$ (m is a natural number of greater than or equal to 4).

In the common line driver circuit, amplitude voltage of an image signal written into signal lines ($SL_1$ to $SL_n$) can be decreased by performing frame inversion driving and by synchronizing the timing at which the common potential is output from the shift register described in this embodiment with the timing at which scan lines ($GL_1$ to $GL_n$) are selected in a pixel portion.

Since the amplitude voltage of the image signal can be decreased, power consumption of the liquid crystal display device can be reduced and the margin of the withstand voltage of the transistor which drives the liquid crystal element can be small.

Alternatively, the voltage of the scan line driver circuit and the amplitude voltage of the image signal written into the signal line can be decreased in gate line inversion driving, whereby power consumption of the liquid crystal display device can be reduced.

This embodiment can be implemented in appropriate combination with the structures described in other embodiments.

Embodiment 4

In this embodiment, the configuration of a driver circuit included in the liquid crystal display device illustrated in FIG. 22 of Embodiment 1 will be specifically described with reference to FIGS. 16A to 16C.

Figure 16A:
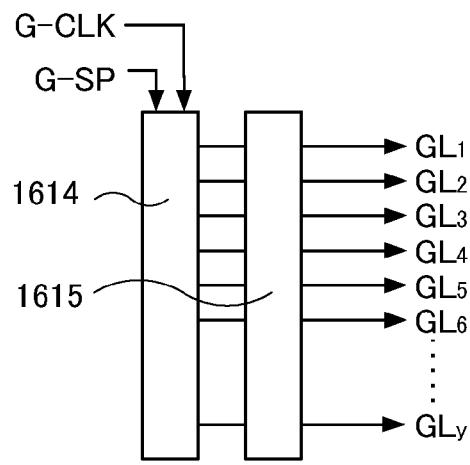
FIGS. 16A to 16C each show a configuration of a driver circuit according to an embodiment of the present invention.

FIG. 16A shows the configuration of the scan line driver circuit 2204. The scan line driver circuit 2204 includes a shift register 1614 and a buffer 1615. Note that in FIG. 16A, a plurality of scan lines (GL) are denoted by $GL_1$ to $GL_y$ (y is a given natural number).

Figure 16B:
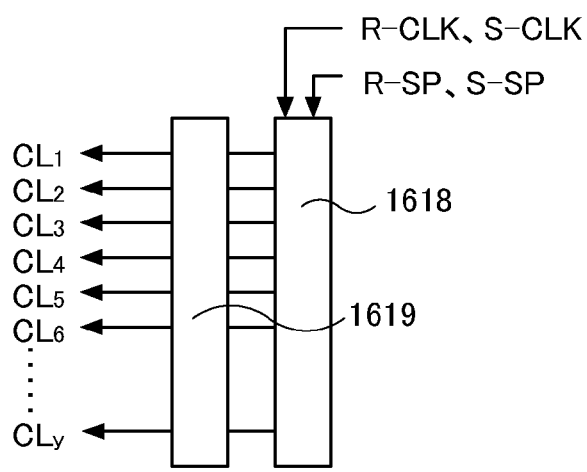

FIG. 16B shows the configuration of the common line driver circuit 2205. The common line driver circuit 2205 includes a shift register 1618 and a buffer 1619. Note that in FIG. 16B, a plurality of common lines (CL) are denoted by $CL_1$ to $CL_y$ (y is a given natural number). The shift register described in any of Embodiments 1 to 3 can be applied to the shift register 1618 of the common line driver circuit 2205.

Figure 16C:
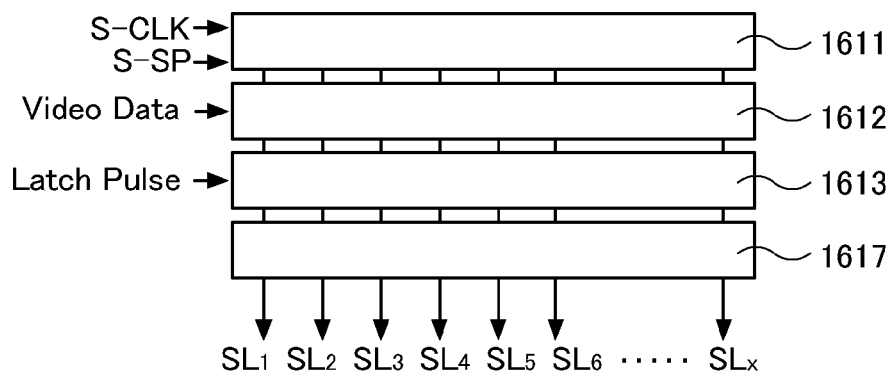

FIG. 16C shows the configuration of the signal line driver circuit 2203. The signal line driver circuit 2203 includes a shift register 1611, a first latch circuit 1612, a second latch circuit 1613, and a buffer 1617. Note that in FIG. 16C, a plurality of signal lines (SL) are denoted by $SL_1$ to $SL_x$ (x is a given natural number).

By using the configuration described in any of Embodiments 1 to 3 for the common line driver circuit, the common line driver circuit can be operated at high frequency even when the shift register is formed by using a transistor which includes amorphous silicon.

In addition, the shift register of the common line driver circuit can be provided with the use of a transistor including an oxide semiconductor. With the transistor including an oxide semiconductor, the off-state current can be reduced, the on-state current and the field-effect mobility can be increased, and the degree of deterioration can be reduced as compared to a transistor including amorphous silicon. Accordingly, malfunction of the common line driver circuit can be reduced, and the common line driver circuit can ensure more accurate operation.

Note that the configurations of the signal line driver circuit, the scan line driver circuit, and the common line driver circuit are not limited to those in FIGS. 16A to 16C; for example, a sampling circuit, a level shifter, or the like may be provided. Further, in addition to the above mentioned driver circuits, a circuit such as a CPU and a controller may also be formed over the substrate 2207. Formation of a circuit such as a CPU and a controller over the substrate 2207 is particularly advantageous for a portable terminal and the like because the number of external circuits (IC) to be connected decreases and further reduction in weight and thickness can be achieved.

This embodiment can be implemented in appropriate combination with the structures described in other embodiments.

Embodiment 5

By driving the liquid crystal display device illustrated in FIG. 22 of Embodiment 1 by AC driving, degradation (burn-in) of the liquid crystal element can be suppressed.

In this embodiment, a specific operation in the case where the liquid crystal display device illustrated in FIG. 22 is driven by AC driving with the use of the shift register described in any of Embodiments 1 to 3 will be described with reference to FIGS. 17A to 17C and FIGS. 18A to 18C.

First, frame inversion driving with the use of the shift register described in Embodiment 1 or 2 will be described with reference to FIGS. 17A to 17C.

Figure 17A:
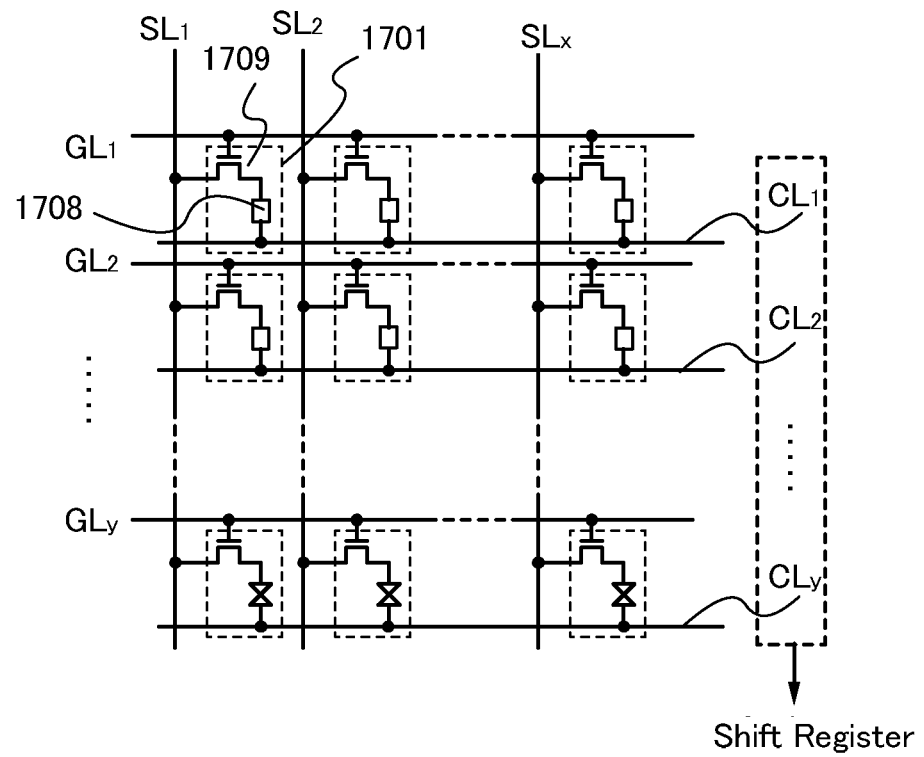
FIGS. 17A to 17C show frame inversion driving according to an embodiment of the present invention.

FIG. 17A shows a circuit diagram of a pixel portion included in the liquid crystal display device. In FIG. 17A, each of a plurality of pixels 1701 includes a liquid crystal element 1708 and a transistor 1709 which controls voltage applied to the liquid crystal element 1708. In addition, a plurality of scan lines (GL) are denoted by $GL_1$ to $GL_y$, (y is a given natural number), a plurality of signal lines (SL) are denoted by $SL_1$ to $SL_x$ (x is a given natural number), and a plurality of common lines (CL) are denoted by $CL_1$ to $CL_y$ (y is a given natural number). The common lines ($CL_1$ to $CL_y$) are connected to the shift register included in the common line driver circuit.

Figure 17B:
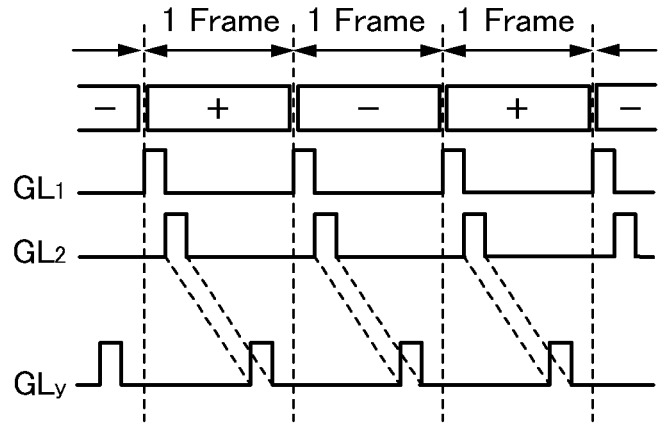

FIG. 17B is a timing chart in the case where the circuit shown in FIG. 17A is driven by frame inversion driving. In FIG. 17B, the polarity of voltage applied between a first electrode and a second electrode is denoted by "+" or "−". In one frame, the plurality of scan lines ($GL_1$ to $GL_y$) are sequentially selected.

Figure 17C:
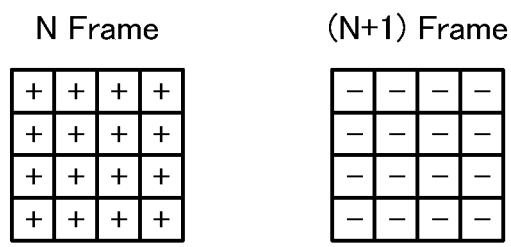

The schematic diagram in FIG. 17C shows the scene where the polarity of a voltage applied between the first electrode and the second electrode of the liquid crystal element 1708 is switched alternately every frame as for continuous frames: an n-th frame (n is a given natural number) and a (n+1)-th frame.

In the case of frame inversion driving, the polarity of a potential of an image signal written into the signal line (SL) is inverted, with the voltage of the second electrode of the liquid crystal element 1708 as a reference. The frame inversion driving can prevent degradation of the liquid crystal element.

By inverting the polarity of the potential of the image signal, the potential of the first electrode (also referred to as a pixel electrode) of the liquid crystal element 1708 is changed, and the polarity of the voltage applied between the first electrode and the second electrode is switched. Therefore, the range of the potential needed for the image signal written into the signal line (SL) is twice that in the case where the frame inversion driving is not performed.

Therefore, in this embodiment, the potential of the second electrode (also referred to as a counter electrode or a common electrode) is changed in synchronization with the inversion of the polarity of the potential of the image signal.

Specifically, in the n-th frame in FIG. 17C, the timing at which the scan lines ($GL_1$ to $GL_y$) are selected is synchronized with the timing at which the common potential (TCOML) is output as the output signals OUT(1) to OUT(y) from the shift register in the first period 401 to the third period 403 described with reference to FIG. 4. In addition, in the (n+1)-th frame in FIG. 17C, the timing at which the scan lines ($GL_1$ to $GL_y$) are selected is synchronized with the timing at which the common potential (TCOMH) is output as the output signals OUT(1) to OUT(y) from the shift register in the fourth period 404 to the sixth period 406 described with reference to FIG. 4.

As described above, by synchronizing the timing at which the scan lines ($GL_1$ to $GL_y$) are selected with the timing at which the common potential is output from the shift register, the amplitude voltage of the image signal written into the signal lines ($SL_1$ to $SL_x$) can be decreased. Thus, power consumption of the liquid crystal display device can be reduced.

Next, gate line inversion driving with the use of the shift register described in Embodiment 3 will be described with reference to FIGS. 18A to 18C.

Figure 18A:
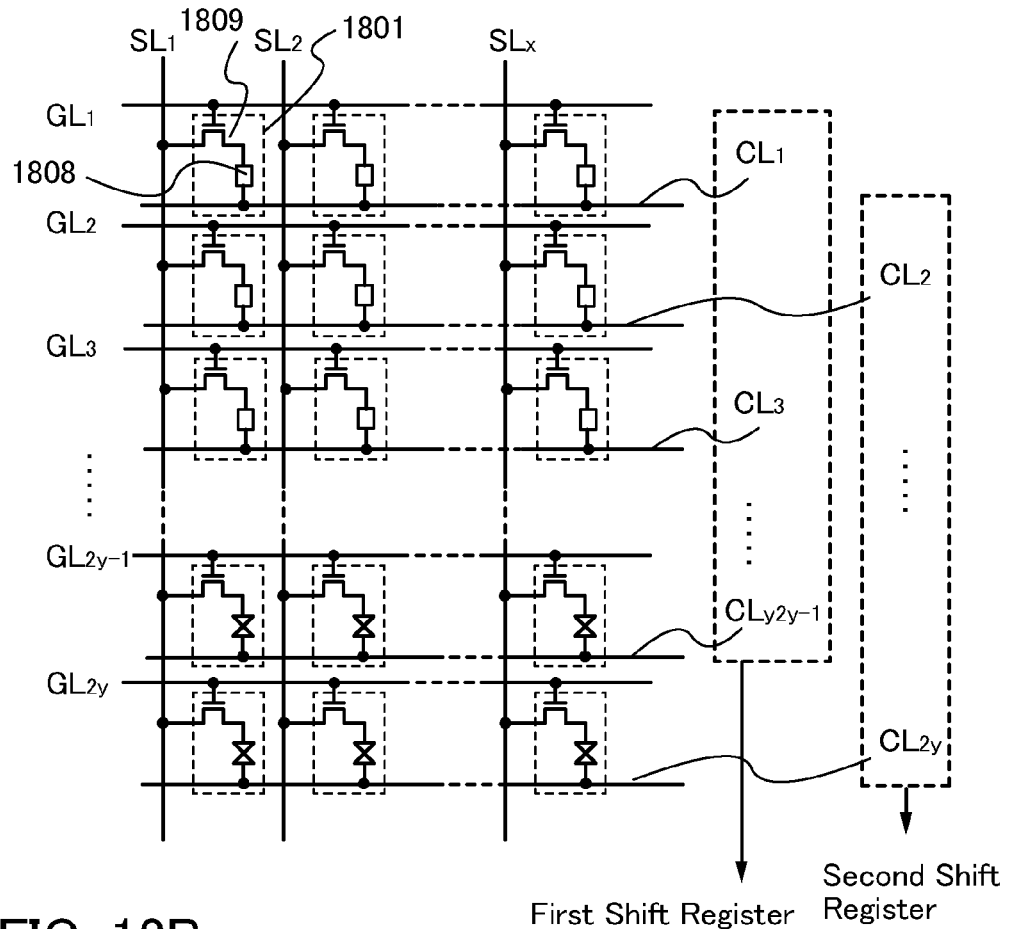
FIGS. 18A to 18C show gate line inversion driving according to an embodiment of the present invention.

FIG. 18A shows a circuit diagram of a pixel portion included in the liquid crystal display device. In FIG. 18A, each of a plurality of pixels 1801 includes a liquid crystal element 1808 and a transistor 1809 which controls voltage applied to the liquid crystal element 1808. In addition, a plurality of scan lines (GL) are denoted by $GL_1$ to $GL_{2y}$, (y is a given natural number), a plurality of signal lines (SL) are denoted by $SL_1$ to $SL_x$ (x is a given natural number), and a plurality of common lines (CL) are denoted by $CL_1$ to $CL_{2y}$, (y is a given natural number). The common lines ($CL_1$, $CL_3$ to $CL_{2y-1}$) (y is a given natural number) are connected to a first shift register included in a common line driver circuit, and the common lines ($CL_2$, $CL_4$ to $CL_{2y}$) (y is a given natural number) are connected to a second shift register included in the common line driver circuit.

Figure 18B:
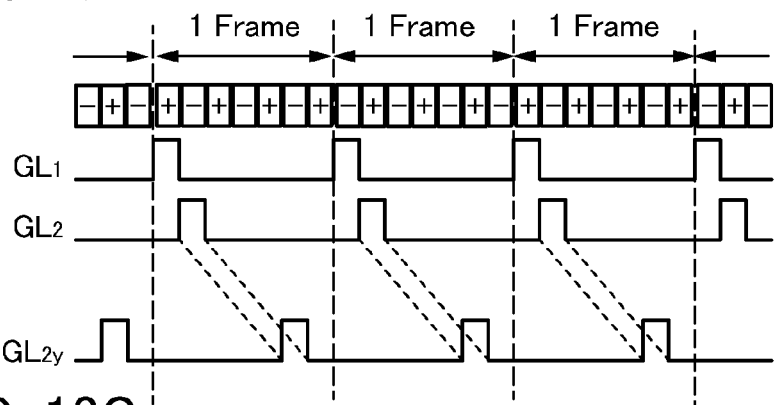

FIG. 18B is a timing chart in the case where the circuit shown in FIG. 18A is driven by gate line inversion driving. In FIG. 18B, the polarity of voltage applied between a first electrode and a second electrode is denoted by "+" or "−". In one frame, the plurality of scan lines ($GL_1$ to $GL_{2y}$) are sequentially selected.

Figure 18C:
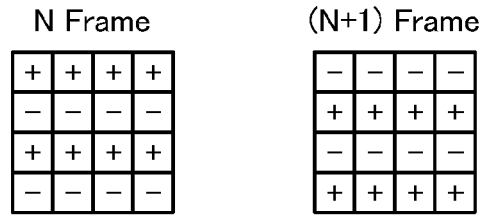

The schematic diagram in FIG. 18C shows the scene where the polarity of a voltage applied between the first electrode and the second electrode of the liquid crystal element 1808 is switched alternately every row as for continuous frames: an n-th frame (n is a given natural number) and a (n+1)-th frame.

In the case of gate line inversion driving, the polarity of a potential of an image signal written into the signal line (SL) is inverted, with the voltage of the second electrode of the liquid crystal element 1808 as a reference, in every scan line (GL) selection period. Accordingly, image signals having polarities opposite to each other are input to pixels connected to adjacent scan lines (GL). By gate line inversion driving, degradation of the liquid crystal element can be prevented and flickers can be reduced.

By inverting the polarity of the potential of the image signal, the potential of the first electrode (also referred to as a pixel electrode) of the liquid crystal element 1808 is changed, and the polarity of the voltage applied between the first electrode and the second electrode is switched. Therefore, the range of the potential needed for the image signal written into the signal line (SL) is twice that in the case where the gate line inversion driving is not performed.

Therefore, in this embodiment, the potential of the second electrode (also referred to as a counter electrode or a common electrode) is changed in synchronization with the inversion of the polarity of the potential of the image signal.

Specifically, in the n-th frame in FIG. 18C, the timing at which the scan lines (GL$_1$ to GL$_{2y}$) are selected is synchronized with the timing at which the common potential (TCOML) or the common potential (TCOMH) is output as the output signals OUT(1) to OUT(2$y$) from the shift register in the first period 1501 to the fifth period 1505 described with reference to FIG. 15. In addition, in the (n+1)-th frame in FIG. 18C, the timing at which the scan lines (GL$_1$ to GL$_{2y}$) are selected is synchronized with the timing at which the common potential (TCOMH) or the common potential (TCOML) is output as the output signals OUT(1) to OUT(2$y$) from the shift register in the sixth period 1506 to the tenth period 1510 described with reference to FIG. 15.

As described above, by synchronizing the timing at which the scan lines (GL$_1$ to GL$_{2y}$) are selected with the timing at which the common potential is output from the shift register, the amplitude voltage of the image signal written into the signal lines (SL$_1$ to SL$_x$) can be decreased. Thus, power consumption of the liquid crystal display device can be reduced.

This embodiment can be implemented in appropriate combination with the structures described in other embodiments.

Embodiment 6

In this embodiment, an example of a structure of a pixel in a display panel of a liquid crystal display device will be described with reference to FIGS. 19A and 19B.

Figure 19A:
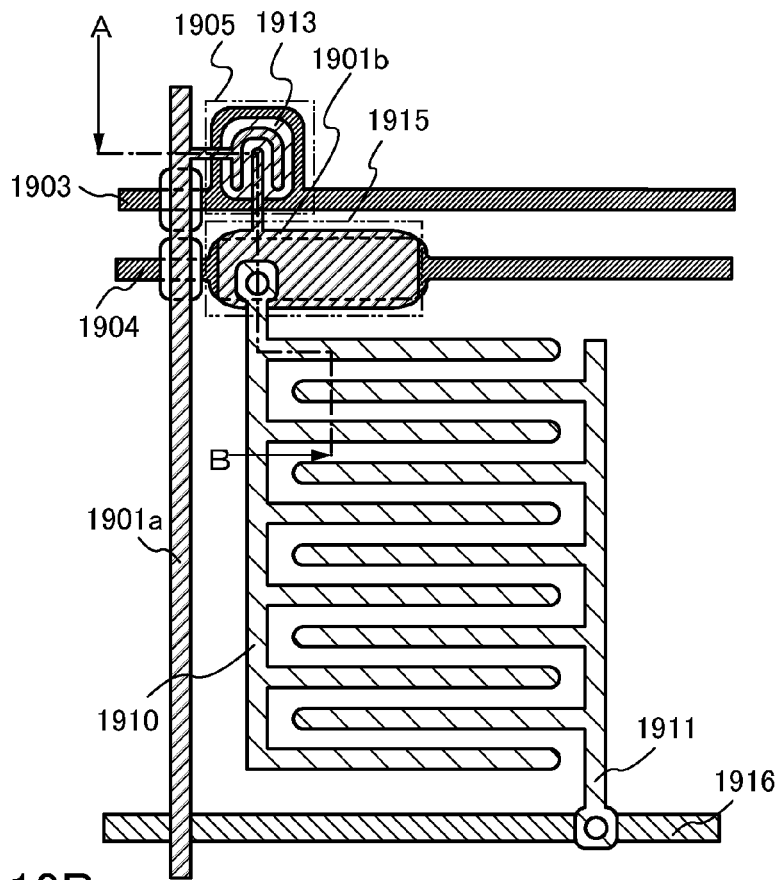
FIGS. 19A and 19B each illustrate a structure of a pixel of a display panel according to an embodiment of the present invention.

FIG. 19A is a plan view of one of a plurality of pixels included in the display panel. FIG. 19B is a cross-sectional view taken along dashed and dotted line A-B of FIG. 19A.

Note that a pixel is a display unit which can control the brightness of one color component (e.g., one of R (red), G (green), and B (blue)). Accordingly, in the case of color display, a minimum display unit of a color image is formed of three pixels: an R pixel, a G pixel, and a B pixel. Note that the color elements for displaying a color image are not limited to three colors, and color elements of more than three colors may be used or a color other than RGB may be used.

In FIG. 19A, a wiring layer (including a source electrode layer 1901$a$ or a drain electrode layer 1901$b$) serving as a signal line is provided to extend in a vertical direction (in a column direction) in the drawing. A wiring layer (including a gate electrode layer 1903) serving as a scan line is provided to be approximately orthogonal to the source electrode layer 1901$a$ (to extend in a horizontal direction (row direction)) in the drawing. A capacitor wiring layer 1904 is provided to extend approximately parallel to the gate electrode layer 1903, and approximately orthogonal to the source electrode layer 1901$a$ (in a horizontal direction (row direction) in the drawing).

In FIG. 19A, a transistor 1905 which includes the gate electrode layer 1903 is provided in a pixel of the display panel. An insulating film 1907 and an interlayer film 1909 are provided over the transistor 1905.

Figure 19B:
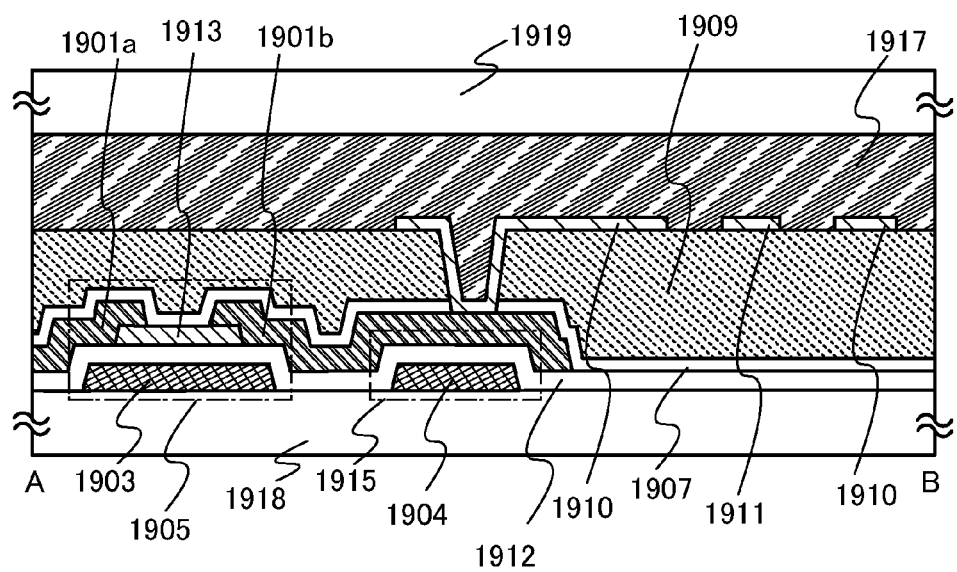

The pixel in the display panel illustrated in FIGS. 19A and 19B includes a transparent electrode layer 1910 as an electrode layer connected to the transistor 1905 and a transparent electrode layer 1911 connected to a common line 1916. The transparent electrode layer 1910 and the transparent electrode layer 1911 have a comb-like shape and are provided apart from each other so as to engage with each other. An opening (a contact hole) is formed in the insulating film 1907 and the interlayer film 1909 which are over the transistor 1905. In the opening (contact hole), the transparent electrode layer 1910 and the transistor 1905 are connected to each other.

The transistor 1905 illustrated in FIGS. 19A and 19B includes a semiconductor layer 1913 provided over the gate electrode layer 1903 with a gate insulating layer 1912 therebetween, and the source electrode layer 1901$a$ and the drain electrode layer 1901$b$ which are in contact with the semiconductor layer 1913. In addition, the capacitor wiring layer 1904, the gate insulating layer 1912, and the drain electrode layer 1901$b$ are stacked to form a capacitor 1915.

Further, a first substrate 1918 and a second substrate 1919 are provided so as to overlap with each other with the transistor 1905 and a liquid crystal layer 1917 provided therebetween.

FIG. 19B illustrates an example of using an inverted-staggered transistor with a bottom-gate structure as the transistor 1905. Note that a structure of a transistor which can be applied to the liquid crystal display device disclosed in this specification is not particularly limited. For example, a transistor with a top-gate structure in which a gate electrode layer is provided over a semiconductor layer with a gate insulating layer provided therebetween, a staggered transistor and a planar transistor with a bottom-gate structure in which a gate electrode layer is provided below a semiconductor layer with a gate insulating layer provided therebetween, and the like can be used.

Further, the transistor 1905 may have any of a single gate structure including one channel formation region, a double gate structure including two channel formation regions, or a triple gate structure including three channel formation regions. Alternatively, the transistor may have a dual gate structure including two gate electrode layers positioned over and below a channel formation region with a gate insulating layer provided therebetween.

This embodiment can be implemented in appropriate combination with the structures described in other embodiments.

Embodiment 7

In this embodiment, examples of the structure of a transistor which can be applied to the liquid crystal display device disclosed in this specification will be described with reference to FIGS. 20A to 20D. FIGS. 20A to 20D each illustrate a cross-sectional structure of a transistor.

Each of the transistors illustrated in FIGS. 20A to 20D includes an oxide semiconductor as a semiconductor layer. An advantage of using an oxide semiconductor is that high field-effect mobility (the maximum value is greater than or equal to 5 cm$^2$/Vsec, preferably 10 cm$^2$/Vsec to 150 cm$^2$/Vsec) can be obtained when the transistor is on, and small off-state current (for example, the off-state current per channel width is less than 1 aA/μm, preferably less than 10 zA/μm and less than 100 zA/μm at 85° C.) can be obtained when the transistor is off.

Figure 20A:
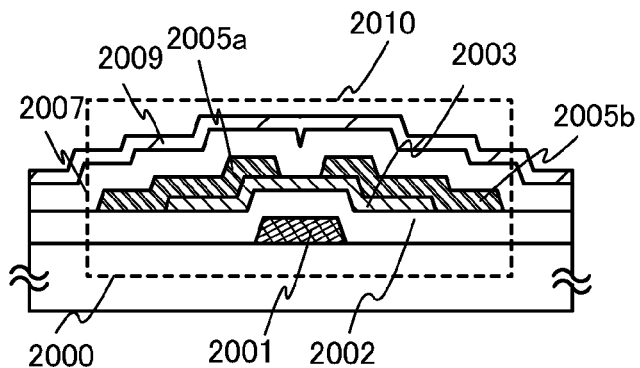
FIGS. 20A to 20D each illustrate a structure of a transistor according to an embodiment of the present invention.

A transistor 2010 illustrated in FIG. 20A is a kind of bottom-gate transistor and is also called an inverted staggered transistor.

The transistor 2010 includes, over a substrate 2000 having an insulating surface, a gate electrode layer 2001, a gate insulating layer 2002, an oxide semiconductor layer 2003, a source electrode layer 2005a, and a drain electrode layer 2005b. In addition, an insulating layer 2007 which covers the transistor 2010 and is stacked over the oxide semiconductor layer 2003 is provided. Moreover, a protective insulating layer 2009 is formed over the insulating layer 2007.

Figure 20B:
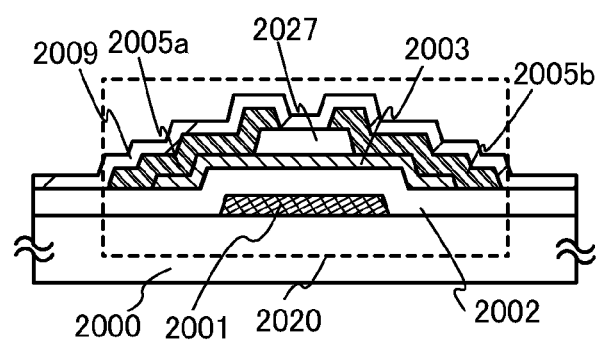

A transistor 2020 illustrated in FIG. 20B has a kind of bottom-gate structure called a channel-protective type (a channel-stop type) and is also called an inverted staggered transistor.

The transistor 2020 includes, over a substrate 2000 having an insulating surface, a gate electrode layer 2001, a gate insulating layer 2002, an oxide semiconductor layer 2003, an insulating layer 2027 functioning as a channel protective layer and covering a channel formation region of the oxide semiconductor layer 2003, a source electrode layer 2005a, and a drain electrode layer 2005b. A protective insulating layer 2009 is formed to cover the transistor 2020.

Figure 20C:
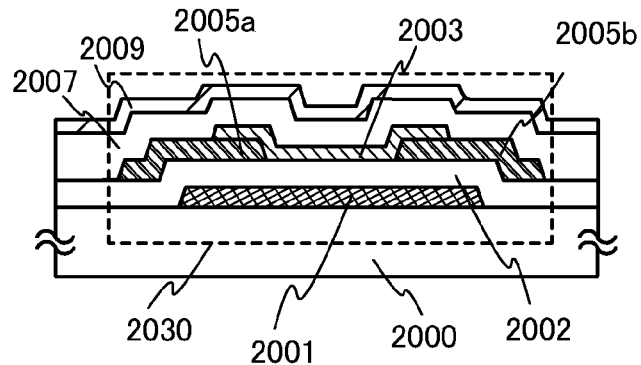

A transistor 2030 illustrated in FIG. 20C is a bottom-gate transistor which includes, over a substrate 2000 having an insulating surface, a gate electrode layer 2001, a gate insulating layer 2002, a source electrode layer 2005a, a drain electrode layer 2005b, and an oxide semiconductor layer 2003. In addition, an insulating layer 2007 which covers the transistor 2030 and is in contact with the oxide semiconductor layer 2003 is provided. Moreover, a protective insulating layer 2009 is formed over the insulating layer 2007.

In the transistor 2030, the gate insulating layer 2002 is provided on and in contact with the substrate 2000 and the gate electrode layer 2001, and the source electrode layer 2005a and the drain electrode layer 2005b are provided on and in contact with the gate insulating layer 2002. Further, the oxide semiconductor layer 2003 is provided over the gate insulating layer 2002, the source electrode layer 2005a, and the drain electrode layer 2005b.

Figure 20D:
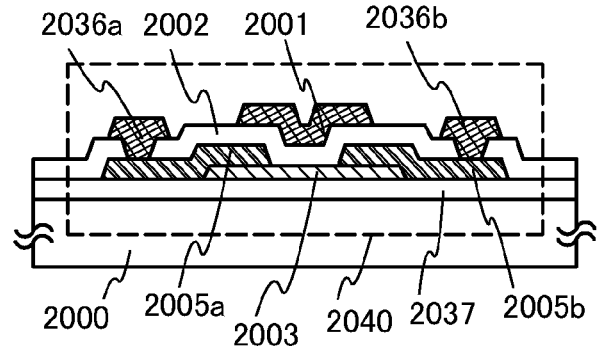

A transistor 2040 illustrated in FIG. 20D is a kind of top-gate transistor. The transistor 2040 includes, over a substrate 2000 having an insulating surface, an insulating layer 2037, an oxide semiconductor layer 2003, a source electrode layer 2005a, a drain electrode layer 2005b, a gate insulating layer 2002, and a gate electrode layer 2001. A wiring layer 2036a and a wiring layer 2036b are provided in contact with and connected to the source electrode layer 2005a and the drain electrode layer 2005b, respectively.

In this embodiment, as described above, the oxide semiconductor layer 2003 is used as a semiconductor layer. Examples of an oxide semiconductor used for the oxide semiconductor layer 2003 include: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; and an In—O-based oxide semiconductor, a Sn—O-based oxide semiconductor, or a Zn—O-based oxide semiconductor; and the like.

The above oxide semiconductor can contain $SiO_2$. In this specification, for example, an In—Ga—Zn—O-based oxide semiconductor means an oxide film containing indium (In), gallium (Ga), and zinc (Zn), and there is no particular limitation on the composition ratio. Further, the In—Ga—Zn—O-based oxide semiconductor may contain an element other than In, Ga, and Zn.

As the oxide semiconductor layer 2003, a thin film of a material expressed by a chemical formula, $InMO_3(ZnO)_m$ (m>0), can be used. Here, M represents one or more metal elements selected from gallium (Ga), aluminum (Al), manganese (Mn), and cobalt (Co). For example, M can be gallium (Ga), gallium (Ga) and aluminum (Al), gallium (Ga) and manganese (Mn), gallium (Ga) and cobalt (Co), or the like.

In the transistors 2010, 2020, 2030, and 2040 each including the oxide semiconductor layer 2003, a current value in an off-state (off-state current value) can be small. Thus, in a pixel, a capacitor for holding an electric signal such as an image signal can be designed to be small. Therefore, the aperture ratio of the pixel can be increased. The increase in aperture ratio can realize low power consumption.

In addition, each of the transistors 2010, 2020, 2030, and 2040 including the oxide semiconductor layer 2003 has small off-state current. Accordingly, in a pixel, an electric signal such as an image signal can be held for a longer period and a writing interval can be set longer. Therefore, the length of one frame period can be set longer, and the frequency of refresh operations in a still image display period can be reduced, whereby an effect of suppressing power consumption can be further increased. In addition, since a driver circuit and a pixel portion can be formed over one substrate with the use of the transistor, the number of components of the liquid crystal display device can be reduced.

There is no particular limitation on the substrate that can be used as the substrate 2000 having an insulating surface. As the substrate 2000, a glass substrate such as a barium borosilicate glass substrate or an aluminoborosilicate glass substrate can be used.

In the bottom-gate transistors 2010, 2020, and 2030, an insulating film serving as a base film may be provided between the substrate and the gate electrode layer. The base film has a function of preventing diffusion of an impurity element from the substrate, and can be formed with a single-layer structure or a layered structure including one or more of a silicon nitride film, a silicon oxide film, a silicon nitride oxide film, and a silicon oxynitride film.

The gate electrode layer 2001 can be formed to have a single-layer structure or a layered structure using a metal material such as molybdenum, titanium, chromium, tantalum, tungsten, aluminum, copper, neodymium, or scandium, or an alloy material which contains any of these materials as its main component.

The gate insulating layer 2002 can be formed to have a single-layer structure or a layered structure including one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. For example, by a plasma CVD method, a silicon nitride layer ($SiN_y$, (y>0)) with a thickness of greater than or equal to 50 nm and less than or equal to 200 nm is formed as a first gate insulating layer, and a silicon oxide layer ($SiO_x$ (x>0)) with a thickness of greater than or equal to 5 nm and less than or equal to 300 nm is formed as a second gate insulating layer over the first gate insulating layer, so that a gate insulating layer with a total thickness of 200 nm is formed.

As a conductive film for forming the source electrode layer 2005a and the drain electrode layer 2005b, for example, a metal film containing an element selected from aluminum (Al), chromium (Cr), copper (Cu), tantalum (Ta), titanium (Ti), molybdenum (Mo), and tungsten (W), or a metal nitride film containing any of the above elements as its component (a titanium nitride film, a molybdenum nitride film, a tungsten nitride film, or the like) can be used. A metal film having a high melting point such as a film of titanium (Ti), molybdenum (Mo), tungsten (W), or the like or a metal nitride film of any of these elements (a titanium nitride film, a molybdenum nitride film, or a tungsten nitride film) may be stacked on one of or both a lower side and an upper side of a metal film of aluminum (Al), copper (Cu), or the like.

A conductive film for forming the wiring layer 2036a and the wiring layer 2036b connected to the source electrode layer 2005a and the drain electrode layer 2005b can be formed using a material similar to that of the source electrode layer 2005a and the drain electrode layer 2005b.

In addition, the conductive film for forming the source electrode layer 2005a and the drain electrode layer 2005b (including a wiring layer formed using the same layer as the source electrode layer 2005a and the drain electrode layer 2005b) may be formed using conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, referred to as ITO), an alloy of indium oxide and zinc oxide ($In_2O_3$—ZNO), or such a metal oxide material containing silicon oxide can be used.

As the insulating layer 2007 and the insulating layer 2027 provided over the oxide semiconductor layer, and the insulating layer 2037 provided below the oxide semiconductor layer, an inorganic insulating film such as a silicon oxide film, a silicon oxynitride film, an aluminum oxide film, or an aluminum oxynitride film, or the like can be typically used.

For the protective insulating layer 2009 provided over the oxide semiconductor layer, an inorganic insulating film such as a silicon nitride film, an aluminum nitride film, a silicon nitride oxide film, an aluminum nitride oxide film, or the like can be typically used.

An insulating film for planarization may be formed over the protective insulating layer 2009 in order to reduce surface unevenness caused by the transistor. For the insulating film for planarization, for example, an organic material such as polyimide, an acrylic resin, or benzocyclobutene-based resin can be used. Other than such organic materials, it is also possible to use a low-dielectric constant material (a low-k material) or the like. Note that the insulating film for planarization may be formed by stacking a plurality of insulating films formed of these materials.

As described above, the off-state current of the transistor including the oxide semiconductor layer formed according to this embodiment can be made small. Accordingly, in a pixel, an electric signal such as an image signal can be held for a longer period and a writing interval can be set longer. Therefore, the length of one frame period can be set longer, and the frequency of refresh operations in a still image display period can be reduced, whereby an effect of suppressing power consumption can be further increased. In addition, an oxide semiconductor layer is preferably used as a semiconductor layer because such a layer can be formed without a process such as laser irradiation and can realize formation of a transistor over a large substrate.

This embodiment can be implemented in appropriate combination with the structures described in other embodiments.

Embodiment 8

The liquid crystal display device disclosed in this specification can be applied to a variety of electronic devices (including a game machine). Examples of the electronic devices are a television device (also referred to as a television or a television receiver), a monitor of a computer or the like, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like. Examples of the electronic devices each including the liquid crystal display device described in the above embodiment will be described with reference to FIGS. 21A to 21D.

Figure 21A:
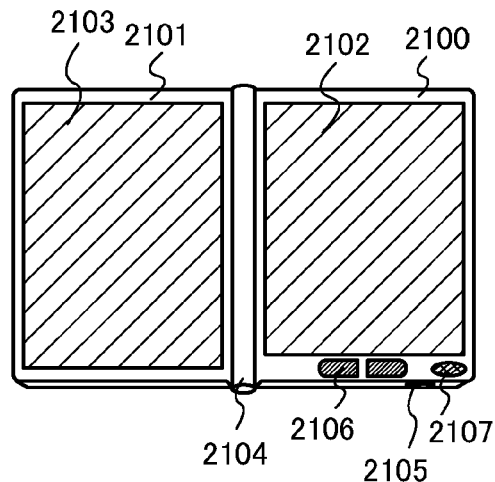
FIGS. 21A to 21D each illustrate an electronic device according to an embodiment of the present invention.

FIG. 21A illustrates an example of an electronic book reader. The electronic book reader illustrated in FIG. 21A includes two housings, a housing 2100 and a housing 2101. The housing 2100 and the housing 2101 are combined with each other by a hinge 2104 so that the electronic book reader can be opened and closed. With such a structure, the electronic book reader can be operated like a paper book.

A display portion 2102 and a display portion 2103 are incorporated in the housing 2100 and the housing 2101, respectively. The display portions 2102 and 2103 may display one image or different images. In the case where the display portion 2102 and the display portion 2103 display different images, for example, text can be displayed on a display portion on the right side (the display portion 2102 in FIG. 21A) and graphics can be displayed on a display portion on the left side (the display portion 2103 in FIG. 21A).

FIG. 21A illustrates an example in which the housing 2100 is provided with an operation portion and the like. For example, the housing 2100 is provided with a power supply input terminal 2105, an operation key 2106, a speaker 2107, and the like. With the operation key 2106, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as a USB cable, or the like), a recording medium insert portion, or the like may be provided on the back surface or the side surface of the housing. Further, a function of an electronic dictionary may be provided for the electronic book reader illustrated in FIG. 21A.

Figure 21B:
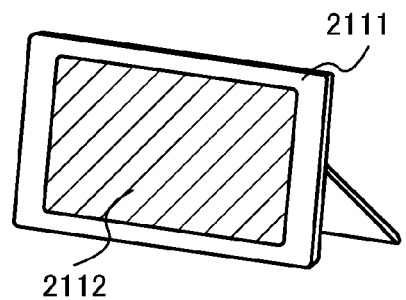

FIG. 21B illustrates an example of a digital photo frame including the liquid crystal display device. For example, in the digital photo frame illustrated in FIG. 21B, a display portion 2112 is incorporated in a housing 2111. The display portion 2112 can display various images. For example, the display portion 2112 can display image data taken with a digital camera or the like, so that the digital photo frame can function in a manner similar to a normal photo frame.

Note that the digital photo frame illustrated in FIG. 21B is provided with an operation portion, an external connection terminal (a USB terminal, a terminal which can be connected to a variety of cables such as a USB cable, and the like), a recording medium inserting portion, and the like. Although these components may be provided on the surface on which the display portion is provided, it is preferable to provide them on the side surface or the back surface for the design of the digital photo frame. For example, a memory storing image data taken with a digital camera is inserted into the recording medium inserting portion of the digital photo frame and the image data is transferred, whereby the image data can be displayed on the display portion 2112.

Figure 21C:
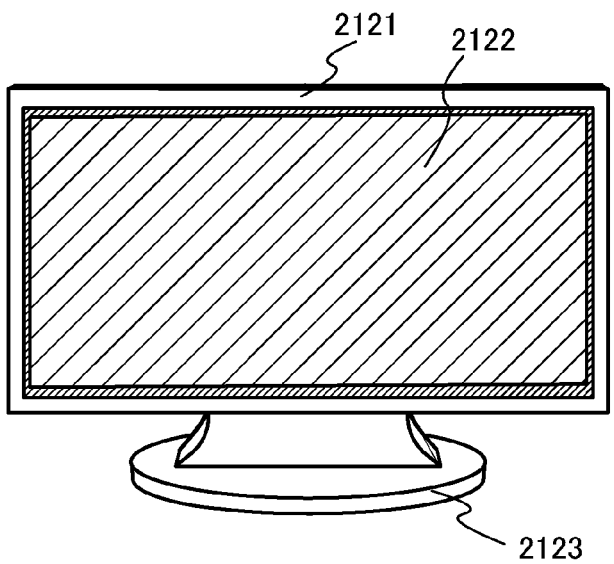

FIG. 21C illustrates an example of a television device including the liquid crystal display device. In the television device illustrated in FIG. 21C, a display portion 2122 is incorporated in a housing 2121. The display portion 2122 can display an image. Here, the housing 2121 is supported by a stand 2123. The liquid crystal display device described in any of the above embodiments can be used for the display portion 2122.

The television device illustrated in FIG. 21C can be operated with an operation switch of the housing 2121 or a separate remote controller. Channels and volume can be controlled by an operation key of the remote controller so that an image displayed on the display portion 2122 can be controlled. Further, the remote controller may be provided with a display portion for displaying data output from the remote controller.

Figure 21D:
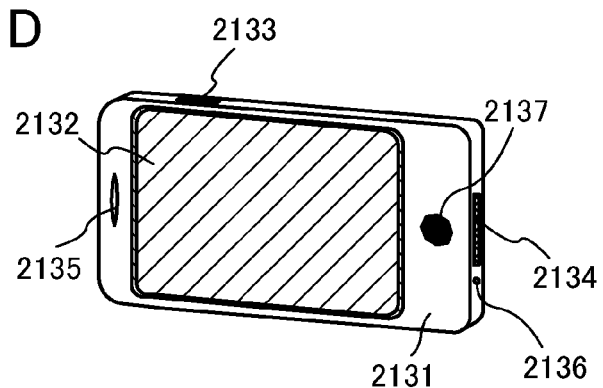

FIG. 21D illustrates an example of a mobile phone including the liquid crystal display device. The mobile phone illustrated in FIG. 21D is provided with a display portion 2132 incorporated in a housing 2131, an operation button 2133, an operation button 2137, an external connection port 2134, a speaker 2135, a microphone 2136, and the like.

The display portion 2132 of the mobile phone illustrated in FIG. 21D is a touchscreen. When the display portion 2132 is touched with a finger or the like, contents displayed on the display portion 2132 can be controlled. Further, making a call, text messaging, or the like can be performed by touching the display portion 2132 with a finger or the like.

This embodiment can be implemented in appropriate combination with the structures described in other embodiments.

This application is based on Japanese Patent Application serial no. 2010-117010 filed with Japan Patent Office on May 21, 2010, the entire contents of which are hereby incorporated by reference.

What is claimed is:

1. A liquid crystal display device comprising:
   pixels arranged in matrix, one of the pixels comprising a liquid crystal element and a transistor which controls a voltage applied to a first electrode of the liquid crystal element;
   common lines, one of the common lines directly connected to the liquid crystal element;
   scan lines;
   a common line driver circuit connected to the common lines; and
   a scan line driver circuit connected to the scan lines,
   wherein the liquid crystal display device is configured such that frame inversion driving is performed,
   wherein, in a first frame period, the common line driver circuit is configured to sequentially supply a first potential to the common lines in synchronization with sequential selection of the scan lines,
   wherein, in a second frame period adjacent to the first frame period, the common line driver circuit is configured to sequentially supply a second potential to the common lines in synchronization with sequential selection of the scan lines,
   wherein the first potential and the second potential are different from each other,
   wherein the common line driver circuit comprises a shift register configured to supply the first potential or the second potential to the common lines, and
   wherein the shift register includes a reset pulse output circuit and a set pulse output circuit.

2. The liquid crystal display device according to claim 1, wherein the reset pulse output circuit comprises a first transistor to a ninth transistor, a first input terminal to a fifth input terminal, an output terminal, and a first power supply line to an eighth power supply line, and
   wherein, in the reset pulse output circuit,
   a first terminal of the first transistor is connected to the first power supply line, a second terminal of the first transistor is connected to a first terminal of the fifth transistor, and a gate of the first transistor is connected to the fourth input terminal,
   a first terminal of the second transistor is connected to the first terminal of the fifth transistor, a second terminal of the second transistor is connected to the second power supply line, and a gate of the second transistor is connected to a gate of the fourth transistor,
   a first terminal of the third transistor is connected to the second input terminal, a second terminal of the third transistor is connected to the output terminal, and a gate of the third transistor is connected to a second terminal of the fifth transistor,
   a first terminal of the fourth transistor is connected to the output terminal and a second terminal of the fourth transistor is connected to the third power supply line,
   a gate of the fifth transistor is connected to the fourth power supply line,
   a first terminal of the sixth transistor is connected to the fifth power supply line, a second terminal of the sixth transistor is connected to the gate of the fourth transistor, and a gate of the sixth transistor is connected to the third input terminal,
   a first terminal of the seventh transistor is connected to the sixth power supply line, a second terminal of the seventh transistor is connected to the gate of the fourth transistor, and a gate of the seventh transistor is connected to the first input terminal,
   a first terminal of the eighth transistor is connected to the seventh power supply line, a second terminal of the eighth transistor is connected to the gate of the fourth transistor, and a gate of the eighth transistor is connected to the fifth input terminal, and
   a first terminal of the ninth transistor is connected to the gate of the fourth transistor, a second terminal of the ninth transistor is connected to the eighth power supply line, and a gate of the ninth transistor is connected to the fourth input terminal.

3. The liquid crystal display device according to claim 2, wherein the first transistor to the ninth transistor in the reset pulse output circuit are n-channel transistors.

4. The liquid crystal display device according to claim 1, wherein the reset pulse output circuit comprises: a first transistor to an eighth transistor, a first input terminal to a fourth input terminal, an output terminal, and a first power supply line to a seventh power supply line, and
   wherein, in the reset pulse output circuit,
   a first terminal of the first transistor is connected to the first power supply line, a second terminal of the first transistor is connected to a first terminal of the fifth transistor, and a gate of the first transistor is connected to the fourth input terminal,
   a first terminal of the second transistor is connected to the first terminal of the fifth transistor, a second terminal of the second transistor is connected to the second power supply line, and a gate of the second transistor is connected to a gate of the fourth transistor, a first terminal of the third transistor is connected to the second input terminal, a second terminal of the third transistor is connected to the output terminal, and a gate of the third transistor is connected to a second terminal of the fifth transistor, a first terminal of the fourth transistor is connected to the output terminal and a second terminal of the fourth transistor is connected to the third power supply line, a gate of the fifth transistor is connected to the fourth power supply line, a first terminal of the sixth transistor is connected to the fifth power supply line, a second terminal of the sixth transistor is connected to the gate of the fourth transistor, and a gate of the sixth transistor is connected to the third input terminal, a first terminal of the seventh transistor is connected to the sixth power supply line, a second terminal of the seventh transistor is connected to the gate of the fourth transistor, and a gate of the seventh transistor is connected to the first input terminal, and a first terminal of the eighth transistor is connected to the gate of the fourth transistor, a second terminal of the eighth transistor is connected to the seventh power supply line, and a gate of the eighth transistor is connected to the fourth input terminal.

5. The liquid crystal display device according to claim 4, wherein the first transistor to the eighth transistor in the reset pulse output circuit are n-channel transistors.

6. The liquid crystal display device according to claim 1, wherein the set pulse output circuit comprises a first transistor to a tenth transistor, a first capacitor, a second capacitor, a first input terminal to a fourth input terminal, a first output terminal, a second output terminal, and a first power supply line to a tenth power supply line, and wherein, in the set pulse output circuit, a first terminal of the first transistor is connected to the first power supply line and a second terminal of the first transistor is connected to the first output terminal, a first terminal of the second transistor is connected to the first output terminal and a second terminal of the second transistor is connected to the second power supply line, a first terminal of the third transistor is connected to the second input terminal, a second terminal of the third transistor is connected to the second output terminal, and a gate of the third transistor is connected to a gate of the first transistor, a first terminal of the fourth transistor is connected to the second output terminal, a second terminal of the fourth transistor is connected to the third power supply line, and a gate of the fourth transistor is connected to a gate of the second transistor, a first terminal of the fifth transistor is connected to a first terminal of the sixth transistor, a second terminal of the fifth transistor is connected to the gate of the first transistor, and a gate of the fifth transistor is connected to the fourth power supply line, a second terminal of the sixth transistor is connected to the fifth power supply line and a gate of the sixth transistor is connected to the gate of the second transistor, a first terminal of the seventh transistor is connected to the sixth power supply line, a second terminal of the seventh transistor is connected to the first terminal of the sixth transistor, and a gate of the seventh transistor is connected to the third input terminal, a first terminal of the eighth transistor is connected to the seventh power supply line, a second terminal of the eighth transistor is connected to the gate of the second transistor, and a gate of the eighth transistor is connected to the first input terminal, a first terminal of the ninth transistor is connected to the eighth power supply line, a second terminal of the ninth transistor is connected to the gate of the second transistor, and a gate of the ninth transistor is connected to the fourth input terminal, a first terminal of the tenth transistor is connected to the gate of the second transistor, a second terminal of the tenth transistor is connected to the ninth power supply line, and a gate of the tenth transistor is connected to the third input terminal, one terminal of the first capacitor is connected to the gate of the first transistor and the other terminal of the first capacitor is connected to the first output terminal, and one terminal of the second capacitor is connected to the gate of the second transistor and the other terminal of the second capacitor is connected to the tenth power supply line.

7. The liquid crystal display device according to claim 6, wherein the first transistor to the tenth transistor in the set pulse output circuit are n-channel transistors.

8. The liquid crystal display device according to claim 1, wherein a liquid crystal layer in the liquid crystal element comprises a liquid crystal material exhibiting a blue phase.

9. An electronic device comprising the liquid crystal display device according to claim 1.

* * * * *